United States Patent
Lin et al.

(10) Patent No.: US 12,464,729 B2
(45) Date of Patent: Nov. 4, 2025

(54) MEMORY DEVICE AND MANUFACTURING METHOD THEREOF

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 579 days.

(21) Appl. No.: 17/749,665

(22) Filed: May 20, 2022

(65) Prior Publication Data
US 2023/0380179 A1    Nov. 23, 2023

(51) Int. Cl.
*H10B 63/00* (2023.01)
*H10B 53/30* (2023.01)

(52) U.S. Cl.
CPC .................................... *H10B 53/30* (2023.02)

(58) Field of Classification Search
CPC ................................ H10B 61/22; H10B 63/30
See application file for complete search history.

(56) References Cited

U.S. PATENT DOCUMENTS

| 2015/0287735 | A1* | 10/2015 | Jeon | H10B 43/27 257/324 |
| 2021/0408041 | A1* | 12/2021 | Oh | H01L 21/31111 |
| 2022/0108741 | A1* | 4/2022 | Hong | H10B 43/27 |

* cited by examiner

*Primary Examiner* — Michele Fan
(74) *Attorney, Agent, or Firm* — Birch, Stewart, Kolasch & Birch, LLP

(57) ABSTRACT

A device includes a word line, a dielectric layer, a gate dielectric layer, a semiconductive layer, a source line, and a memory stack. The word line is over a substrate. The dielectric layer is over the word line and has inner sidewalls over the word line. The gate dielectric layer is in contact with the word line and lines a top surface and inner sidewalls of the dielectric layer. The semiconductive layer is conformally over the gate dielectric layer. The semiconductive layer includes a source portion, a drain portion, and a channel portion. The source portion and the drain portion are over the top surface of the dielectric layer. The channel portion interconnects the source portion and the drain portion and in at a position lower than the source portion. The source line and the memory stack are respectively over the source portion and the drain portion.

20 Claims, 16 Drawing Sheets

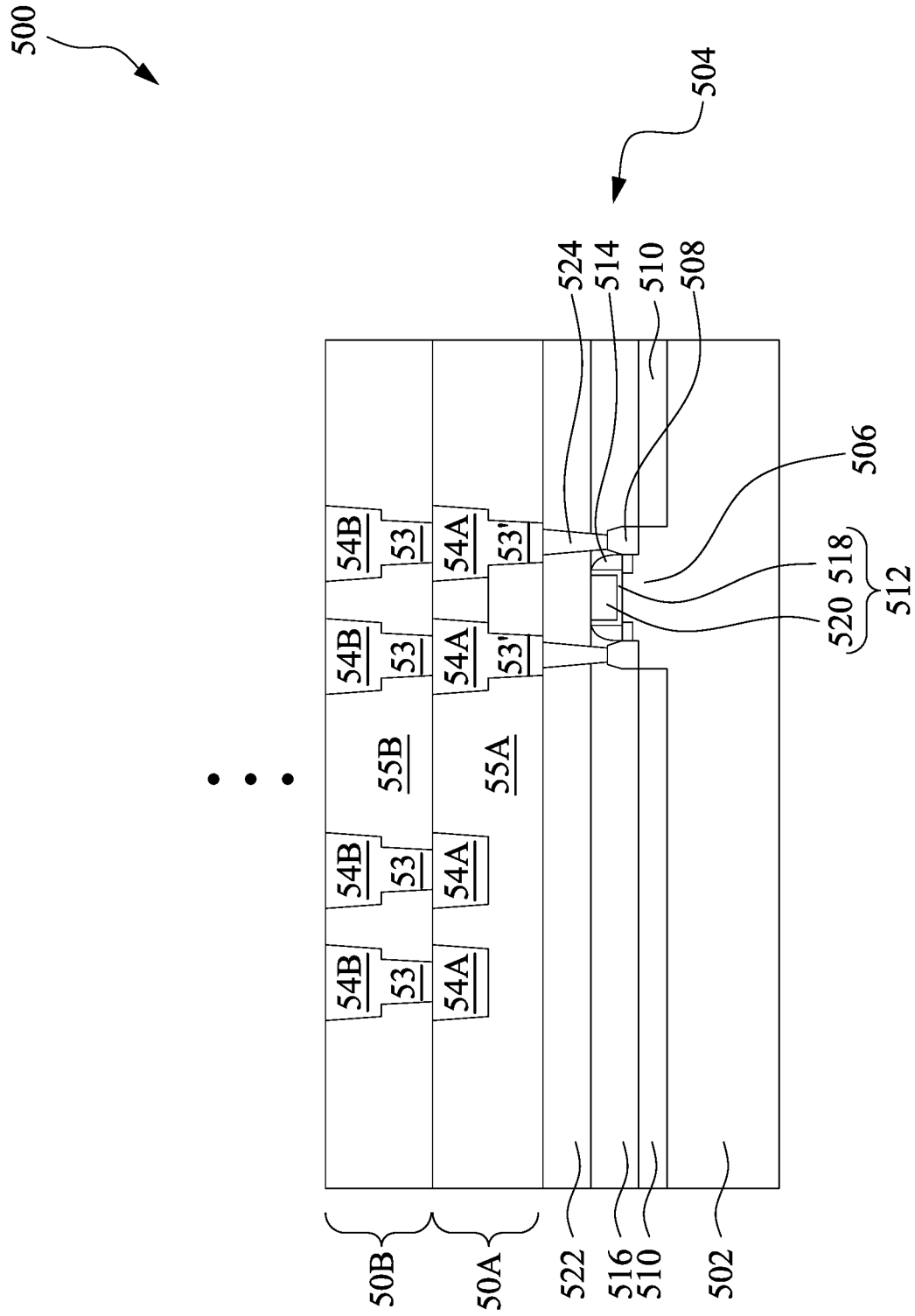

MEMORY DEVICE AND MANUFACTURING METHOD THEREOF

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-10D illustrate a method for manufacturing an integrated circuit (IC) structure having memory cells, at various stages in accordance with some embodiments of the present disclosure.

DETAILED DESCRIPTION

Figure 1A:
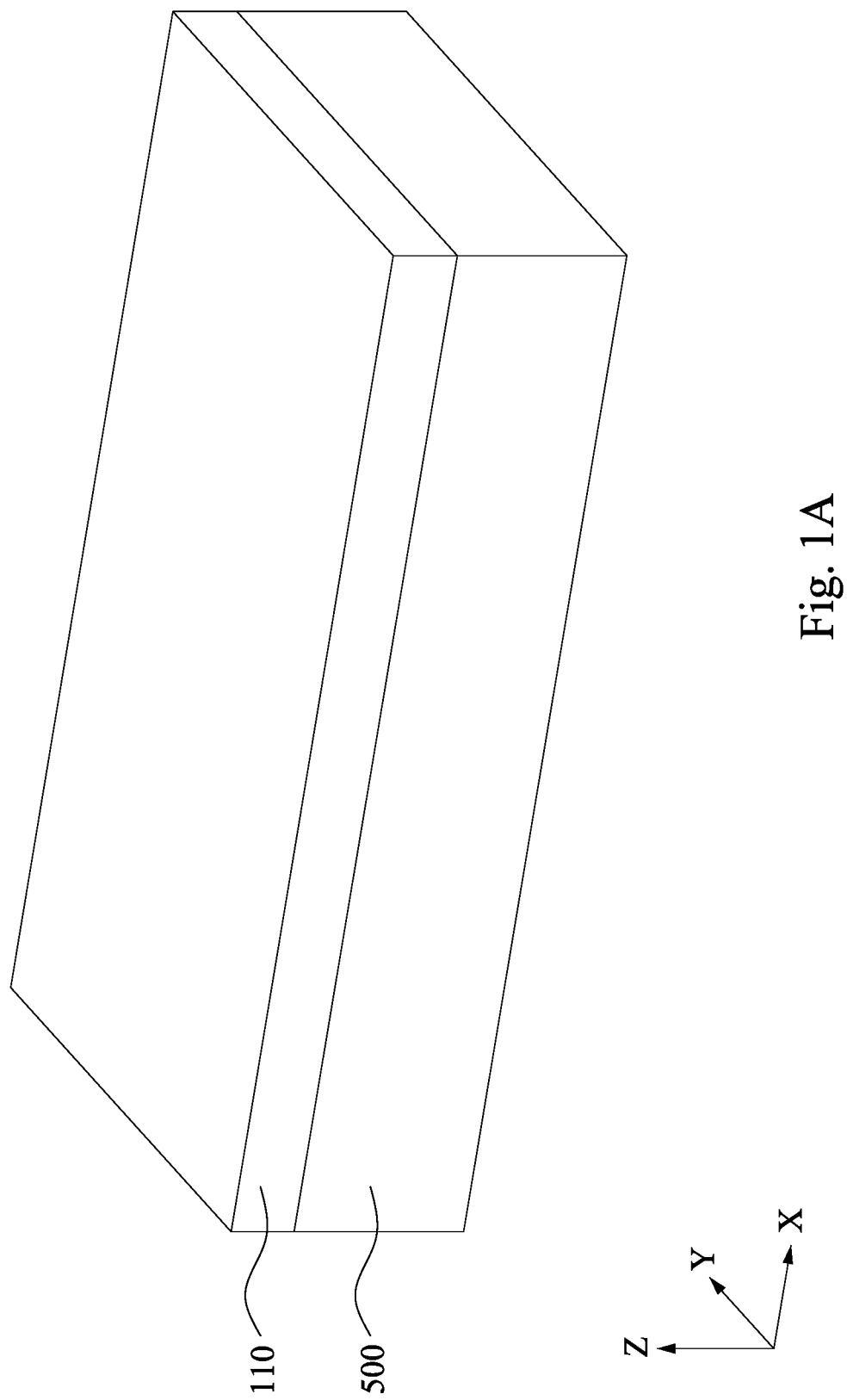

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, Source/drain region(s) may refer to a source or a drain, individually or collectively dependent upon the context.

Memory devices include a grid of independently functioning memory cells formed on a substrate. Memory devices may include volatile memory or nonvolatile (NV) memory cells. In contrast to volatile memory cells that require constant power to retain their memory values, non-volatile memory cells are capable of retaining information when power is not applied thereto. For example, computers including nonvolatile memory cells do not need to be booted up when switched on. Emerging nonvolatile memory technologies may include, by way of example and not limitation, resistive random-access memory (RRAM), magneto-resistive random-access memory (MRAM), ferroelectric (FE) random-access memory (FRAM or FeRAM), and phase-change memory (PCM).

FRAM is a random-access memory that utilizes memory cells that include a FE material to store information as FE polarization. An FE material has an equilibrium-state bulk electric dipole moment. This occurs in solid ceramics when ground state crystal structure involves spatial separation of ionic charges, and the unit cell lacks a center of symmetry. Nanoscale alignment of the microscopic electric dipole moments is responsible for bulk ferroelectric behavior. The magnitude of the dipole polarization and its orientation may be controlled by application of modest electric fields. The change in orientation may be a promising indication of the stored value. FRAM is commonly organized in single-transistor, single-capacitor (1T/1C) or two-transistor, two-capacitor (2T/2C) configurations, in which each memory cell includes one or more access transistors. The non-volatility of an FRAM is due to the hi-stable characteristic of the FE material in the cell capacitor(s).

FRAM memory cells may include a FE tunnel junction (FTJ). Generally, a FTJ may include a metal-FE-metal (MFM) structure, including an FE layer disposed between two metal layers (e.g., electrodes). In FRAM cell fabrication, a word line is formed in a back-end-of-the-line (BEOL) interconnect structure to serve as a gate electrode for an access transistor of FRAM memory cell. A gate dielectric layer and a channel layer are then deposited as horizontal layers over the BEOL interconnect structure. A source line is then formed on a source region of the channel layer, and an MFM structure is formed over a drain region of the channel layer. If a larger cell current is required, it may count on increasing in the channel length in a horizontal direction, which in turn results in an enlarged footprint for each FRAM memory cell, thereby frustrating scaling down of IC. Therefore, various embodiments of the present disclosure generally relate to a FRAM memory device that includes a folded channel layer, instead of a horizontal channel layer. In this way, the channel length of FRAM access transistor can be increased by increasing vertical height of the channel layer without increasing the layout area of memory cells. As a result, the cell current can be improved without impact on memory cell sizes.

FIGS. 1A-10D illustrate a method for manufacturing an integrated circuit (IC) structure having memory cells, at various stages in accordance with some embodiments of the present disclosure. In addition to the IC structure, FIGS. 1A and 2-10A depict X-axis, Y-axis, and Z-axis directions. Although the perspective views and cross-sectional views shown in FIGS. 1A-10D are described with reference to a method, it will be appreciated that the structures shown in FIGS. 1A-10D are not limited to the method but rather may stand alone separate of the method. Although FIGS. 1A-10D are described as a series of acts, it will be appreciated that these acts are not limiting in that the order of the acts can be altered in other embodiments, and the methods disclosed are also applicable to other structures. In some other embodiments, some acts that are illustrated and/or described may be omitted in whole or in part.

FIGS. 1A and 2-10A are perspective views of some embodiments of the IC structure at intermediate stages during fabrication. FIG. 10B is a cross-sectional view of some embodiments of the IC structure during fabrication along a first cut (e.g., cut I-I). FIG. 10C is a cross-sectional view of some embodiments of the IC structure during fabrication along a second cut (e.g., cut II-II). FIG. 10D is a cross-sectional view of some embodiments of the IC structure during fabrication along a third cut (e.g., cut III-III).

FIG. 1A is a perspective view of an example initial structure including an example logic circuit structure 500. FIG. 1B illustrates a cross-sectional view of an example logic circuit structure 500 including a semiconductor substrate 502 in which various electronic devices may be formed, and a portion of a multilevel interconnect structure (e.g., layers 50A and 50B) formed over the substrate 502, in accordance with some embodiments. In some embodiments, FIG. 1B illustrates a transistor 504 formed on the substrate 502, with multiple interconnection layers formed thereover. As indicated by the ellipsis at the top of FIG. 1B, multiple interconnect levels (e.g., a plurality of layers 50B stacked one above another) may be similarly stacked in the fabrication process of an integrated circuit. In the illustrated embodiments, the transistor 504 is a FinFET. In some other embodiments, the transistor 504 is a planar FET, a nanosheet FET, a nanowire FET, or other suitable FET. The transistors 504 and the overlying interconnect wires in the multilevel interconnect structure can be electrically coupled to function as logic circuits.

The substrate 502 illustrated in FIG. 1B may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), or combinations thereof. The semiconductor materials may be doped or undoped. Other substrates that may be used include multi-layered substrates, gradient substrates, or hybrid orientation substrates.

In some embodiments, the FinFET device 504 illustrated in FIG. 1B is a three-dimensional MOSFET structure formed in fin-like strips of semiconductor protrusions 506 referred to as fins. The cross-section shown in FIG. 1B is taken along a longitudinal axis of the fin in a direction parallel to the direction of the current flow between the source and drain regions 508. The fin 506 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 506 by etching a trench into the substrate 502 using, for example, reactive ion etching (RIE). FIG. 1B illustrates a single fin 506, although the substrate 502 may include any number of fins.

Shallow trench isolation (STI) regions 510 formed along opposing sidewalls of the fin 506 are illustrated in FIG. 1B. STI regions 510 may be formed by depositing one or more dielectric materials (e.g., silicon oxide) to completely fill the trenches around the fins and then recessing the top surface of the dielectric materials. The dielectric materials of the STI regions 510 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 510 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 510 such that an upper portion of fin 506 protrudes from surrounding insulating STI regions 510. In some cases, the patterned hard mask used to form the fin 506 may also be removed by the planarization process.

In some embodiments, the gate structure 512 of the FinFET device 504 illustrated in FIG. 1B is a high-k, metal gate (HKMG) gate structure that may be formed using a gate-last process flow. In a gate last process flow a sacrificial dummy gate structure (not shown) is formed after forming the STI regions 510. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 510. As described in greater detail below, the dummy gate structure may be replaced by the HKMG gate structure 512 as illustrated in FIG. 1B. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions (collectively referred to as "source/drain regions" or "S/D regions") 508 and spacers 514 of FinFET 504, illustrated in FIG. 1B, are formed, for example, self-aligned to the dummy gate structures. Spacers 514 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or combinations thereof. The anisotropic etch process removes the spacer dielectric layer from over the top of the dummy gate structures leaving the spacers 514 along the sidewalls of the dummy gate structures.

Source and drain regions 508 are semiconductor regions in direct contact with the semiconductor fin 506. In some embodiments, the source and drain regions 508 may include heavily-doped regions and relatively lightly-doped drain extensions, or LDD regions. Generally, the heavily-doped regions are spaced away from the dummy gate structures using the spacers 514, whereas the LDD regions may be formed prior to forming spacers 514 and, hence, extend under the spacers 514 and, in some embodiments, extend further into a portion of the semiconductor fin 506 below the dummy gate structure. The LDD regions may be formed, for example, by implanting dopants (e.g., As, P, B, In, or the like) using an ion implantation process.

In some embodiments, the source and drain regions 508 may include an epitaxially grown region. For example, after forming the LDD regions, the spacers 514 may be formed and, subsequently, the heavily-doped source and drain regions may be formed self-aligned to the spacers 514 by first etching the fins 506 to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1B. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{15}$ $cm^{-2}$ to $10^{18}$ $cm^{-2}$) of dopants may be introduced into the heavily-doped source and drain regions 508 either in situ during SEG, or by an ion implantation process performed after the SEG, or by combinations thereof.

A first interlayer dielectric (ILD) 516 is deposited over the structure. In some embodiments, a contact etch stop layer (CESL) (not shown) of a suitable dielectric (e.g., silicon nitride, silicon carbide, or the like, or combinations thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 516. The HKMG gate structures 512, illustrated in FIG. 1B, may then be formed by first removing the dummy gate structures using one or more etching techniques, thereby creating trenches between respective spacers 514. Next, a replacement gate dielectric layer 518 including one more dielectrics, followed by a replacement conductive gate layer 520 including one or more conductive materials, are deposited to completely fill the recesses. Excess portions of the gate structure layers 518 and 520 may be removed from over the top surface of first ILD 516 using, for example a CMP process. The resulting structure, as illustrated in FIG. 1B, may be a substantially coplanar surface comprising an exposed top surface of first ILD 516, spacers 514, and remaining portions of the HKMG gate layers 518 and 520 inlaid between respective spacers 514.

The gate dielectric layer 518 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 520 may be a multilayered metal gate stack comprising a barrier layer, a work function layer, and a gate-fill layer formed successively on top of gate dielectric layer 518. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like.

A second ILD layer 522 may be deposited over the first ILD layer 516, as illustrated in FIG. 1B. In some embodiments, the insulating materials to form the first ILD layer 516 and the second ILD layer 522 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 516 and the second ILD layer 522 may be deposited using any suitable method, such as CVD, physical vapor deposition (PVD), ALD, PEALD, PECVD, SACVD, FCVD, spin-on, and/or the like, or a combination thereof.

As illustrated in FIG. 1B, electrodes of electronic devices formed in the substrate 502 may be electrically connected to conductive features of a first interconnect level 50A using conductive connectors (e.g., contacts 524) formed through the intervening dielectric layers. In the embodiment illustrated in FIG. 1B, the contacts 524 make electrical connections to the source and drain regions 508 of FinFET 504. The contacts 524 to gate electrodes may be formed over the STI regions 510, and thus are not shown in the cross-sectional view of FIG. 1B. The contacts may be formed using photolithography techniques. For example, a patterned mask may be formed over the second ILD 522 and used to etch openings that extend through the second ILD 516 to expose a portion of gate structures 512, as well as etch openings that extend further through the first ILD 516 and the CESL (if present) liner below first ILD 516 to expose portions of the source and drain regions 508.

In some embodiments, a conductive liner may be formed in the openings in the first ILD layer 516 and the second ILD layer 522. Subsequently, the openings are filled with a conductive fill material. The liner includes barrier metals used to reduce out-diffusion of conductive materials from the contacts 524 into the surrounding dielectric materials. In some embodiments, the liner may include two barrier metal layers. The first barrier metal comes in contact with the semiconductor material in the source and drain regions 508 and may be subsequently chemically reacted with the heavily-doped semiconductor in the source and drain regions 508 to form a low resistance ohmic contact, after which the unreacted metal may be removed. For example, if the heavily-doped semiconductor in the source and drain regions 508 is silicon or silicon-germanium alloy semiconductor, then the first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 522. The resulting conductive plugs extend into the first and second ILD layers 516 and 522 and constitute contacts 524 making physical and electrical connections to the electrodes of electronic devices, such as the tri-gate FinFET 504 illustrated in FIG. 1B.

As illustrated in FIG. 1B, multiple interconnect levels may be formed, stacked vertically above the contact plugs 524 formed in the first and second ILD layers 516 and 522, in accordance with a back end of line (BEOL) scheme adopted for the integrated circuit design. In the BEOL scheme illustrated in FIG. 1B, various interconnect levels have similar features. However, it is understood that other embodiments may utilize alternate integration schemes wherein the various interconnect levels may use different features. For example, the contacts 524, which are shown as vertical connectors, may be extended to form conductive lines which transport current laterally.

In this disclosure, the interconnect level includes conductive vias and lines embedded in an inter-metal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1B, conductive vias 53' connect contacts 524 to conductive lines 54A and, at subsequent levels, vias connect lower lines to upper lines (e.g., lines 54A and 54B can be connected by via 53). Other embodiments may adopt a different scheme. For example, vias 53' may be omitted from the second level and the contacts 524 may be configured to be directly connected to lines 54A.

The first interconnect level 50A may be formed using, for example, a dual damascene process flow. First, a dielectric stack used to form IMD layer 55A may be deposited using one or more layers of the dielectric materials listed in the description of the first and second ILD layers 516 and 522. In some embodiments, IMD layer 55A includes an etch stop layer (not shown) positioned at the bottom of the dielectric stack. The etch stop layer includes one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 516 and 522.

Appropriate photolithography and etching techniques (e.g., anisotropic RIE employing fluorocarbon chemistry) may be used to pattern the IMD layer 55A to form openings for vias and lines. The openings for vias may be vertical holes extending through IMD layer 55A to expose a top conductive surface of contacts 524, and openings for lines may be longitudinal trenches formed in an upper portion of the IMD layer 55A. In some embodiments, the method used to pattern holes and trenches in IMD 55A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 55A and stop on an etch stop dielectric layer. Then, the etchants may be switched to remove the etch stop layer dielectric materials. The parameters of the various etch operations (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 53' and 54A of the first interconnect level 50A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 53' and lines 54A includes one or more layers of TaN, Ta, TiN, Ti, Co, or the like, or combinations thereof. The conductive fill layer in the vias 53' and lines 54A may include metals such as Cu, Al, W, Co, Ru, or the like, or combinations thereof, or multi-layers thereof. The conductive materials used in forming the conductive features 53' and 54A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD 55A outside of the openings may be removed by a planarizing process (e.g., CMP) thereby forming a top surface comprising dielectric regions of IMD 55A that are substantially coplanar with conductive regions of the conductive lines 54A. The planarization operation embeds the conductive vias 53' and conductive lines 54A into IMD 55A, as illustrated in FIG. 1B.

The interconnect level positioned vertically above the first interconnect level 50A in FIG. 1B, is the second interconnect level 50B. In some embodiments, the structures of the various interconnect levels (e.g., the first interconnect level 50A and the second interconnect level 50B) may be similar. In the example illustrated in FIG. 1B, the second interconnect level 50B includes conductive vias 53 and conductive lines 54B embedded in an insulating film IMD 55B having a planar top surface. The materials and processing techniques described above in the context of the first interconnect level 50A may be used to form the second interconnect level 50B and subsequent interconnect levels.

Although an example electronic device (FinFET 504) and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

In FIG. 1A, a first dielectric layer 110 is formed over the topmost interconnect level 50B. In some embodiments, the first dielectric layer 110 is an oxide layer (e.g., silicon oxide). The materials used to form the first dielectric layer 110 may be deposited using any suitable method such as CVD, plasma-enhanced CVD (PECVD), atomic layer deposition (ALD), plasma-enhanced ALD (PEALD) or the like, or combinations thereof.

Figure 2:
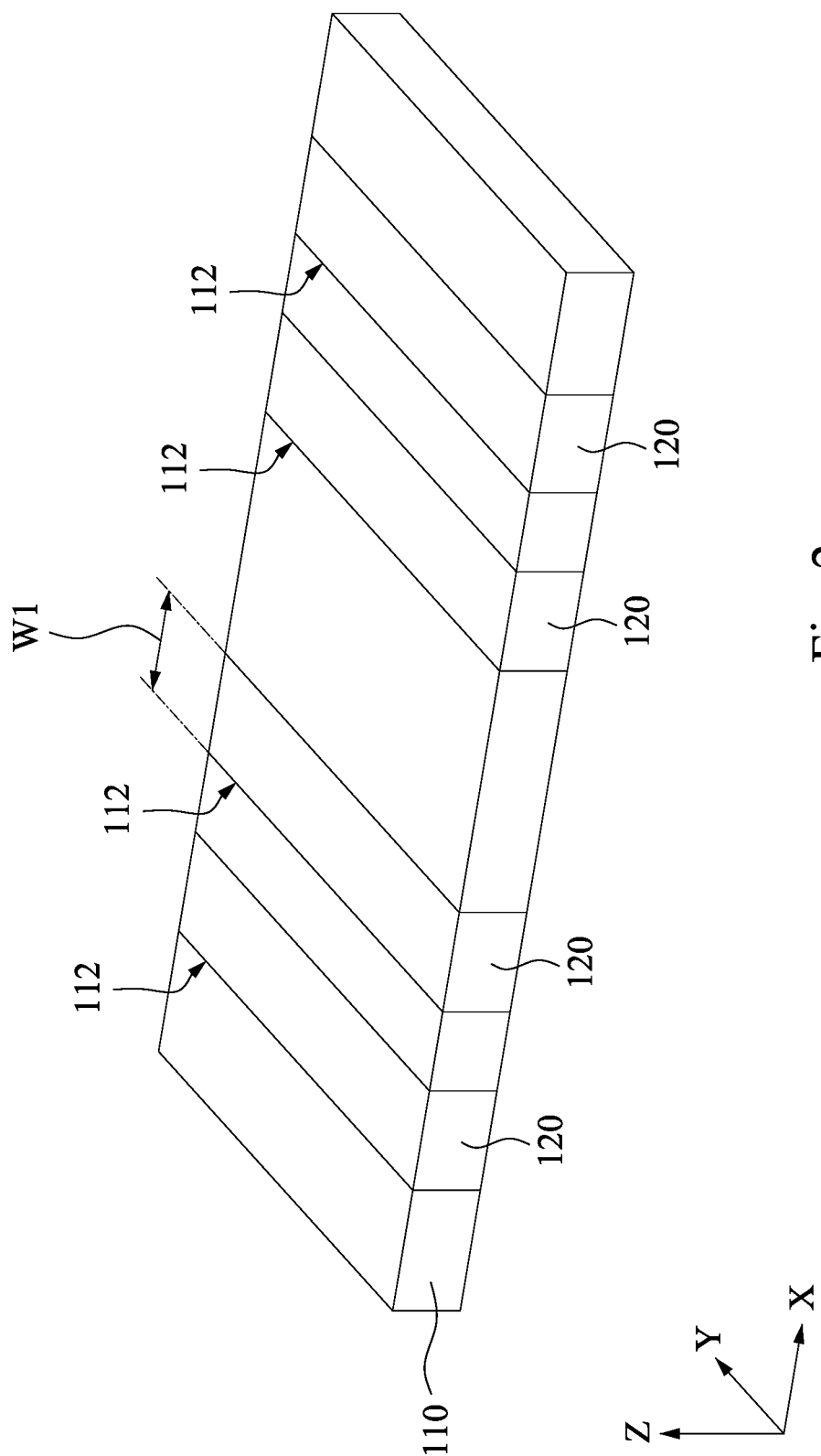

In FIG. 2, the first dielectric layer 110 is patterned to form word line trenches 112 each extending parallel along Y-direction in the first dielectric layer 110. The first dielectric layer 110 is patterned using suitable photolithography and etching techniques. For example, a photoresist layer is formed over the first dielectric layer 110 by using a spin-on coating process, followed by patterning the photoresist layer to expose target regions of the first dielectric layer 110 using suitable photolithography techniques. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used.

After the patterned photoresist layer is formed, an etching process (also called word line trench etching process in this context) is performed on the exposed target regions of the first dielectric layer 110, thus forming word line trenches 112 in the first dielectric layer 110. The word line trench etching process may include one or more dry etching operations, one or more wet etching operations, or combinations thereof. In some embodiments, the word line trench etching process is an anisotropic etching, such as an anisotropic dry etching. Although the resultant word line trenches 112 have vertical sidewalls, the one or more etching operations may lead to tapered sidewalls or curved sidewalls in some other embodiments. In FIG. 2 and following figures, the logic circuit structure 500 is not shown for the sake of clarity. As not shown in FIG. 2, the word line trenches 112 expose some of the conductive vias 53 or lines MB of the second interconnect level 50B of the logic circuit structure 500.

Word lines 120 are formed in the word line trenches 112. In some embodiments, the word lines 120 can be formed by deposing one or more metal materials into the word line trenches 112 by using suitable deposition techniques (e.g., CVD, PVD, ALD or the like) until the word line trenches 112 are overfilled, followed by performing a CMP process on the one or more metal materials at least until the first dielectric layer 110 gets exposed. The one or more metal materials remaining in the word line trenches 112 can serve as word lines 120 extending along Y-direction and spaced apart along X-direction. As mentioned above, since the word line trenches 112 expose some of the conductive vias 53 or lines 54B, the word lines 120 can be electrically connected to the logic circuit structure 500 through the conductive vias 53 or lines 54B.

Because the word lines 120 are formed from a same deposition operation, they share a same metal composition. For example, the word lines 120 each include Al, Ti, TiN, TaN, Co, Ag, Au, Cu, Ni, Cr, Hf, Ru, W, Pt, WN, Ru, combinations thereof, or the like. In some embodiments, each word line 120 is a single-layer structure, if the word line 120 is formed from a single metal. In some embodiments, each word line 120 is a multilayer structure, if the word line is formed from two or more metal layers. In some embodiments, the word lines 120 have top surfaces substantially coplanar or level with a top surface of the first dielectric layer 110, because of the CMP process. In some embodiments, each of the word lines 120 has a width W1 in the X direction and in a range from about 10 nm to about 100 nm.

Figure 3:
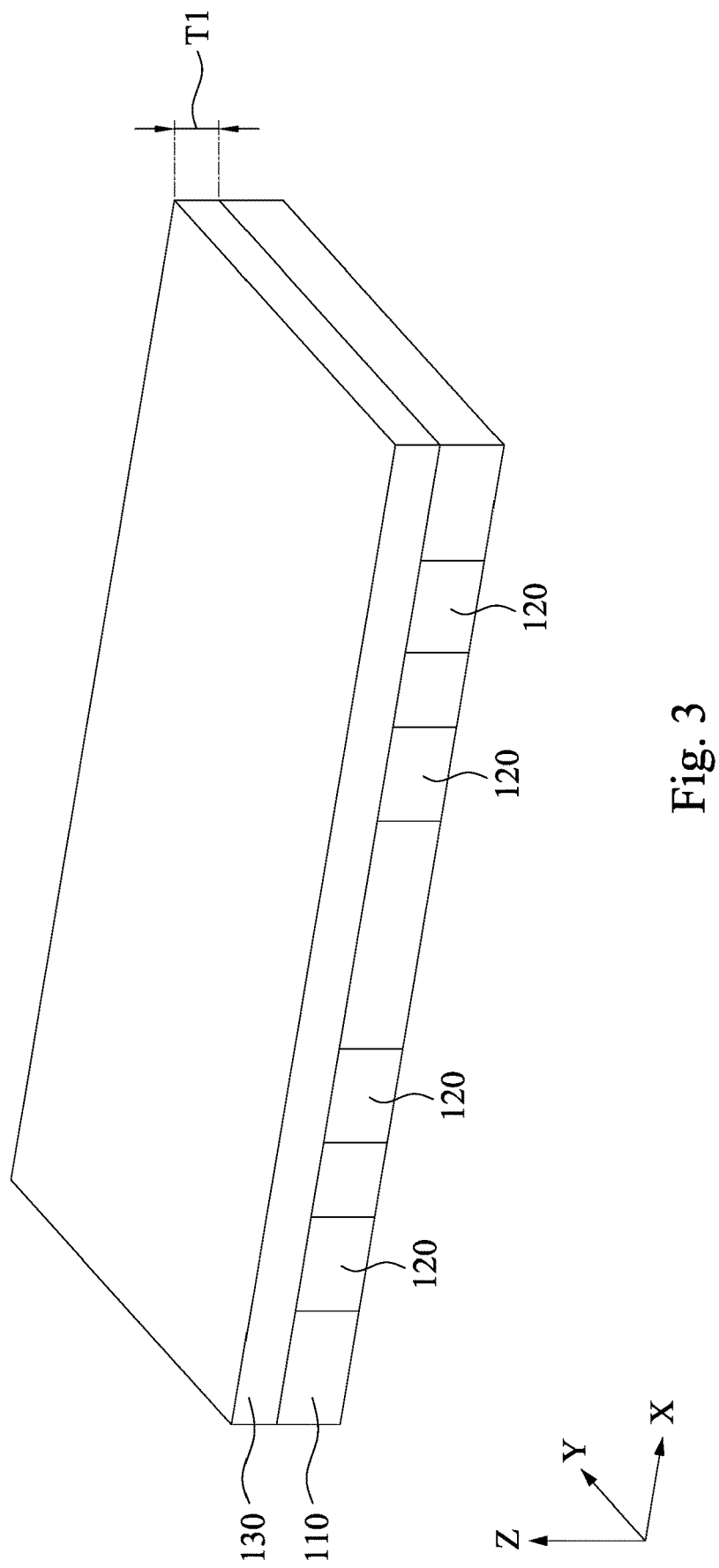
Figure 4:
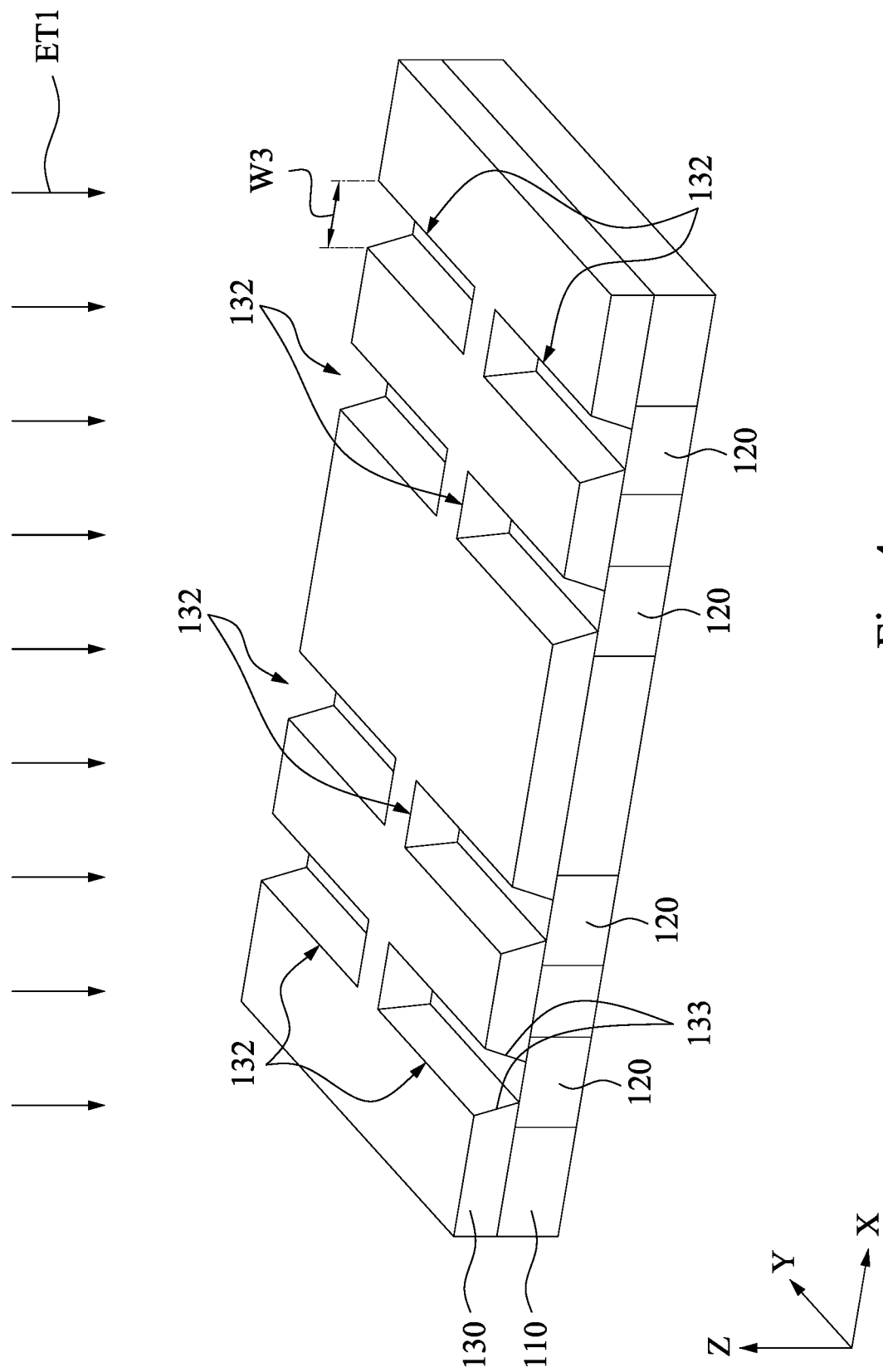

In FIG. 3, a second dielectric layer 130 is formed over the first dielectric layer 110 and the word lines 120 such that the second dielectric layer 130 covers the word lines 120. In some embodiments, the second dielectric layer 130 is a nitride layer (e.g., silicon nitride). Because the second dielectric layer 130 is formed of a different material than first dielectric layer 110 (and the word lines 120), the second dielectric layer 130 has a different etch resistance property than the first dielectric layer 110 (and the word lines 120), which in turn allows forming recesses therein in subsequent processing (as illustrated in FIG. 4). The second dielectric layer 130 has a thickness T1 in the Z direction, which is related to the channel length of the resulting access transistor (s), which will be described in detail below.

In FIG. 4, the second dielectric layer 130 is patterned to form channel recesses 132 each extending parallel along Y-direction in the second dielectric layer 130. The channel recesses 132 each expose a portion of the word lines 120. In some embodiments, a plurality of the channel recesses 132, e.g., two as shown in FIG. 4, can be formed on the same word line 120, and the channel recesses 132 are separated from each other by the second dielectric layer 130. The channel recesses 132 may be formed using suitable photolithography and etching techniques. For example, a photoresist layer is formed over the second dielectric layer 130 by using a spin-on coating process, followed by patterning the photoresist layer to expose target regions of the second dielectric layer 130. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used.

After the patterned photoresist layer is formed, an etching process ET1 (also called channel recess etching process in this context) is performed on the exposed target regions of the second dielectric layer 130, thus forming the channel recesses 132 in the second dielectric layer 130. In some embodiments, the word lines 120 (and/or the first dielectric layer 110) have a higher etch resistance to the channel recess etching process ET1 than that of the second dielectric layer 130. In this way, the word lines 120 can act as a detectable etch end point for the channel recess etching process. The channel trench etching process may include one or more dry etching operations, one or more wet etching operations, or combinations thereof. In some embodiments, the channel recess etching process is an anisotropic etching, such as an anisotropic dry etching. Although the resultant channel recesses 132 have tapered inner sidewalls 133 over the word lines 120, the one or more etching operations may lead to vertical sidewalls (see FIG. 11) or curved sidewalls (see FIGS. 12-15) in some other embodiments. In some embodiments, each of the channel recesses 132 has a width W3 (in the X direction) smaller than the width W1 (see FIG. 2) of the word lines 120.

Figure 5:
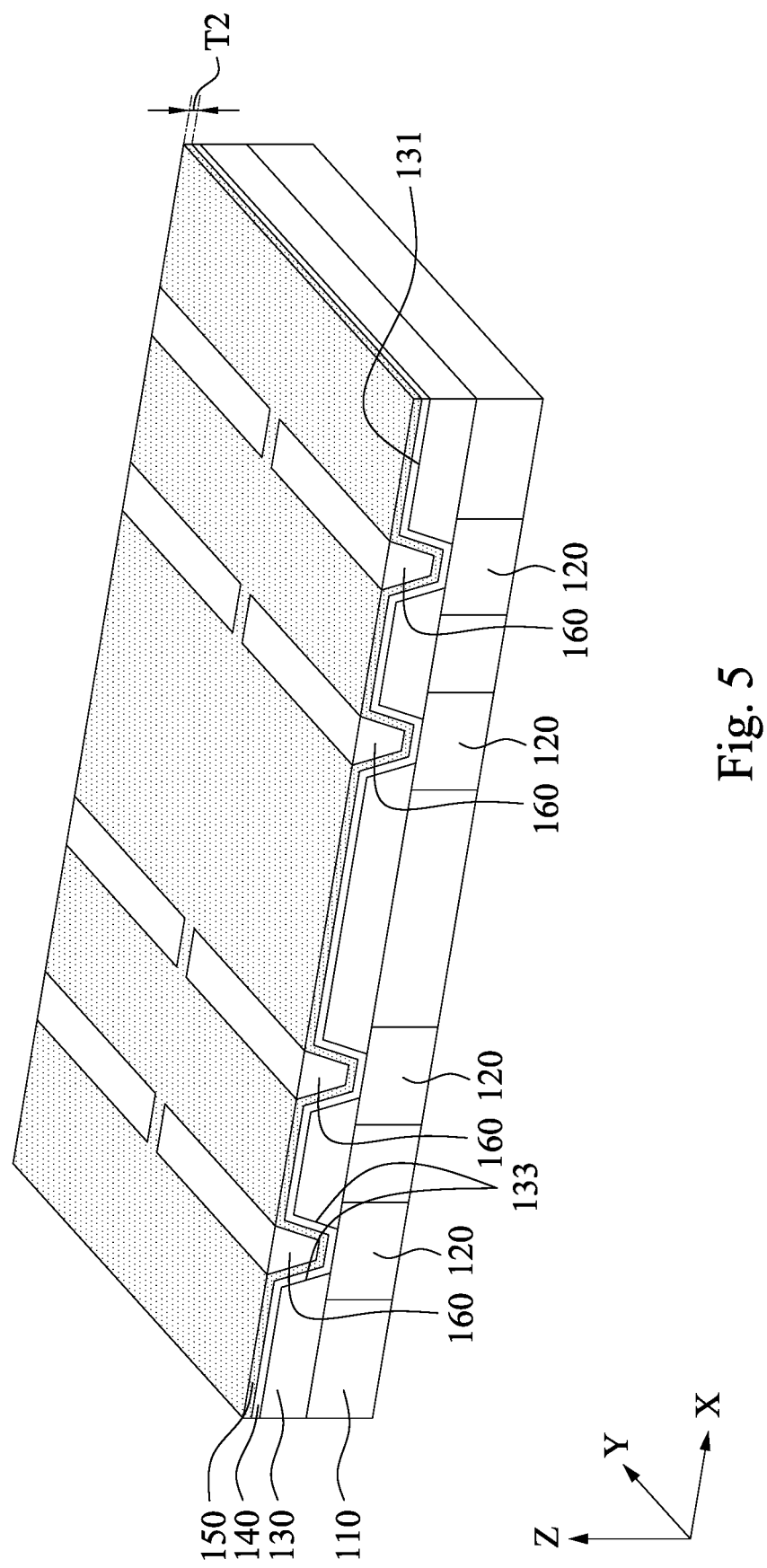

In FIG. 5, a gate dielectric layer 140, a channel material 150, and dielectric filling structures 160 are formed over the structure as illustrated in FIG. 4. In some embodiments, formation of the gate dielectric layer 140 and the channel material 150 includes, for example, conformally depositing a blanket layer of the gate dielectric layer 140 in the channel recesses 132 and over the top surface 131 of the second dielectric layer 130, and then conformally depositing a blanket layer of the channel material 150 over the blanket layer of gate dielectric layer 140. Once the gate dielectric layers 140 and the channel material 150 are formed, a dielectric material is deposited until the channel recesses 132 are overfilled. Afterwards, a CMP process is performed on the dielectric material until top surfaces of the channel material 150 is exposed. Remaining portions of the dielectric material in the channel recesses 132 are denoted as dielectric filling structures 160 that fill the respective channel recesses 132.

The gate dielectric layer 140 is in contact with the word lines 120 and lines the top surface 131 and the inner sidewalls 133 of the first dielectric layer 130. In some embodiments, the gate dielectric layer 140 includes one or more high-k dielectric layers. High-k gate dielectrics, as used and described herein, include dielectric materials having a high dielectric constant, for example, greater than that of thermal silicon oxide (about 3.9). The high-k dielectric material of the gate dielectric layer 140 may include, by way of example and not limitation, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The channel material 150 is formed of a semiconductive material to serve as semiconductor channel(s) of access transistor(s). In some embodiments, the channel material 150 is formed of metal oxide semiconductor such as InGaZnO (IGZO), indium tin oxide (ITO), indium zinc oxide (IZO), ZnO, indium tungsten oxide (IWO), or the like. In some embodiments, the channel material 150 is formed of a silicon-based material such as polysilicon, amorphous silicon or the like. In some embodiments, the channel material 150 is doped with a p-type impurity (e.g., boron) or an n-type impurity (e.g., phosphorus or arsenic). In some embodiments, the width W3 (see FIG. 5) of the channel opening 132 is greater than twice a thickness T2 of the channel material ISO such that the channel material 150 would not fill the channel opening 132.

In some embodiments, the dielectric filling structures 160 are formed of silicon oxide. In some other embodiments, the dielectric filling structures 160 may include phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), the like, or combinations thereof.

Figure 6:
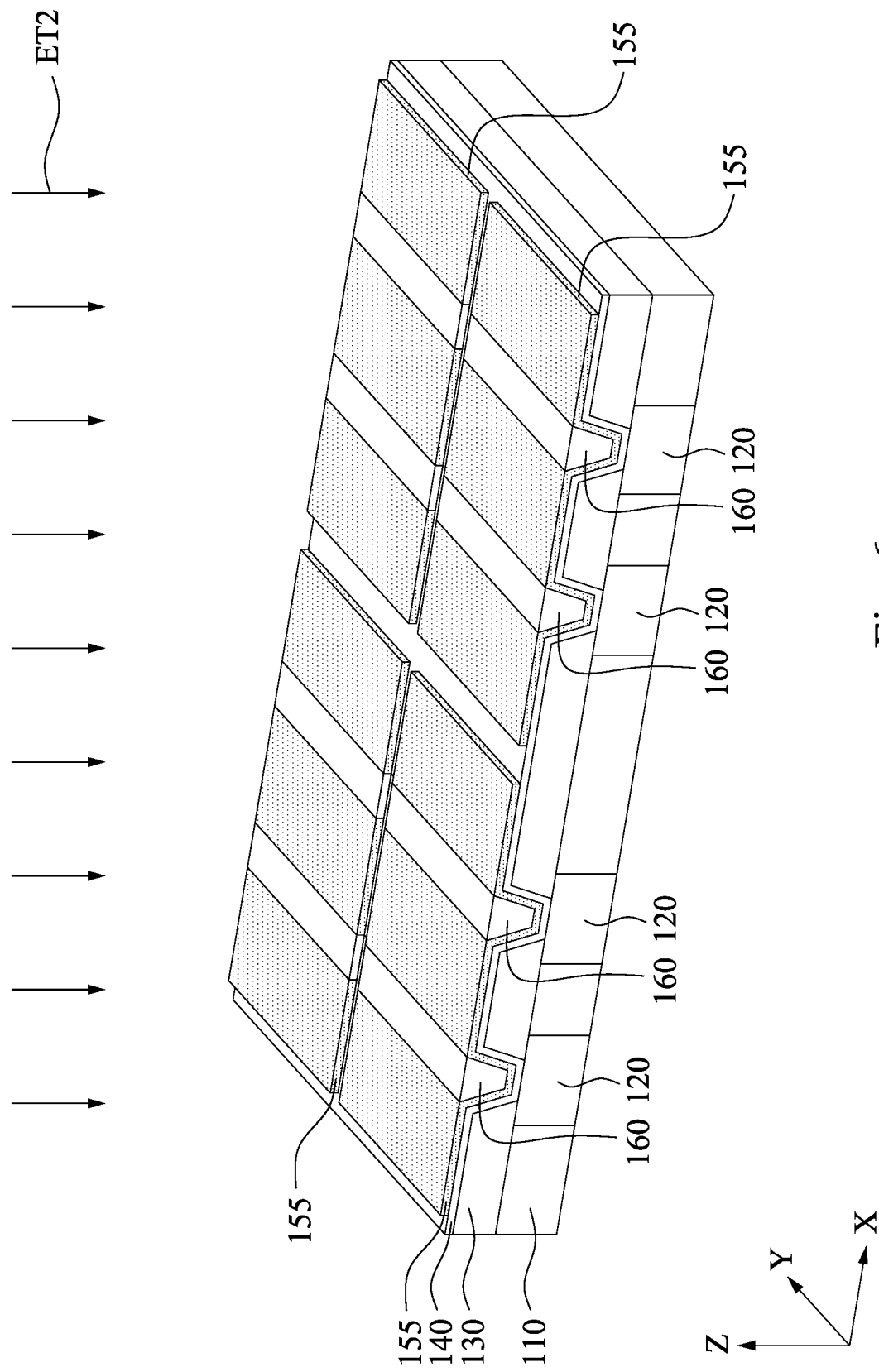

In FIG. 6, the channel material 150 is patterned to separate the continuous channel material 150 into individual channel layers (or semiconductive layers) 155 conformally over the gate dielectric layer 140. For example, photolithography and etching processes (as described above) are performed to pattern the channel material 150. In some embodiments, the channel material 150 is patterned by using a selective etching process ET2. Because the channel material 150 is formed of a different material than the gate dielectric layer 140, etching chemicals of the selective etching process ET2 can be selected to etch the channel material 150 at a faster etch rate than etching the gate dielectric layer 140. As shown in FIG. 6, the channel material 150 is divided into, for example, four channel layers 155. Each of the channel layers 155 has two recessed portions respectively in the channel recesses 132. In some embodiments, the selective etching process ET2 also etches the dielectric filling structures 160, such that the sidewalls of the dielectric filling structures 160 in the Y direction are substantially aligned with the sidewalls of the channel layers 155 as shown in FIG. 6. In some other embodiments, the selective etching process ET2 etches the dielectric filling structures 160 at a rate different from etches the channel material 160, such that the sidewalls of the dielectric filling structures 160 in the Y direction are misaligned with the sidewalls of the channel layers 155. In still some other embodiments, the channel material 150 is patterned by using a dry etching process, a wet etching process, or combinations thereof that etches the channel material 150 and the dielectric filling structures 160. With a control of etching time, the etching process can be stopped without substantially etching the gate dielectric layer 140.

Figure 7:
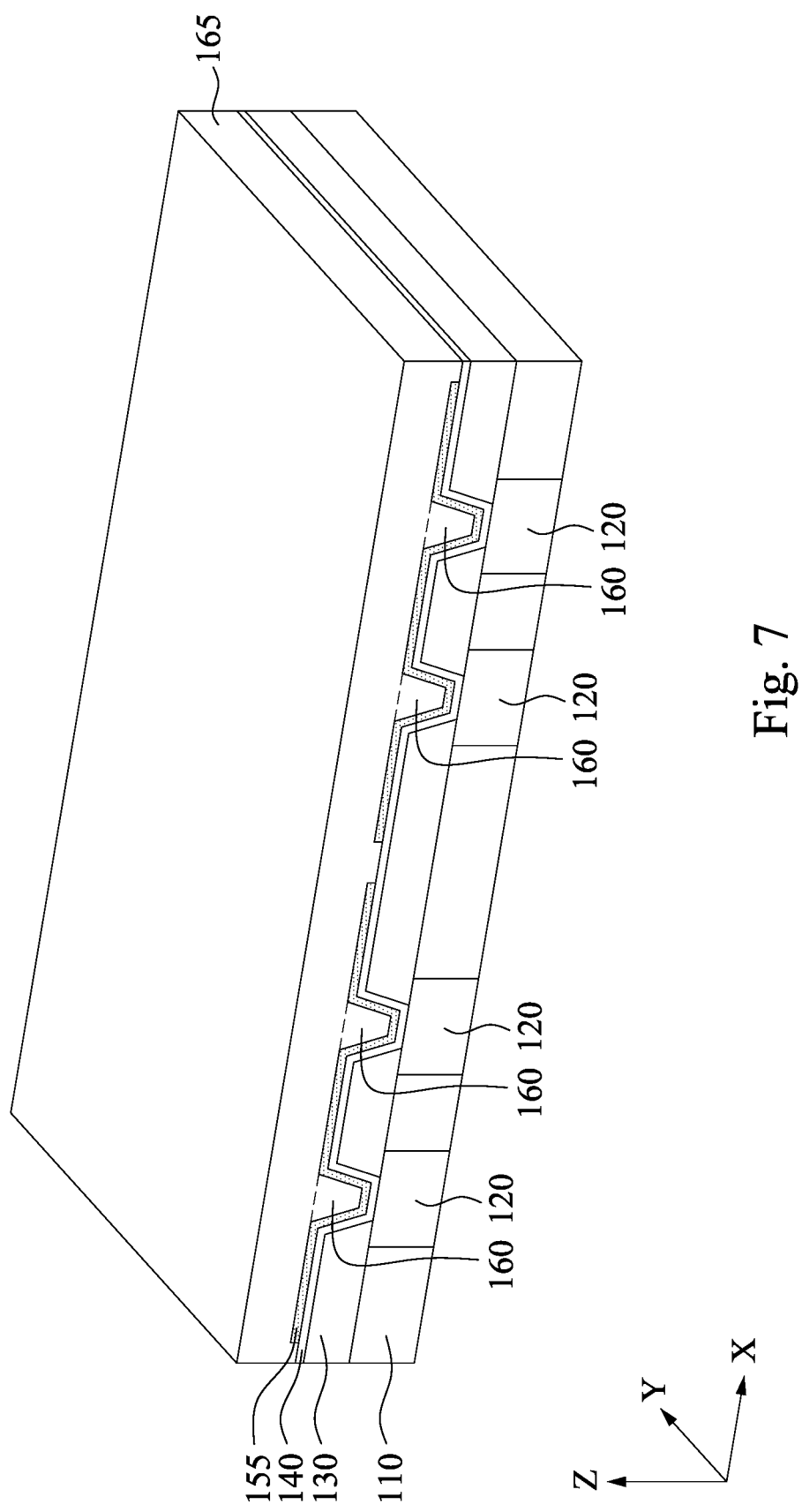

In FIG. 7, a third dielectric layer 165 is formed over the structure as illustrated in FIG. 6. Therefore, the third dielectric layer 165 covers the dielectric filling structures 160, the channel layers 155, and the gate dielectric layer 140. In some embodiments, the third dielectric layer 165 is an oxide layer (e.g., silicon oxide). For example, the third dielectric layer 165 and the dielectric filling structures 160 are made of substantially the same material, such that there may be no interface (illustrated by dashed lines) between the third dielectric layer 165 and the dielectric filling structures 160. The materials used to form the third dielectric layer 165 may be deposited using any suitable method such as CVD, plasma-enhanced CVD (PECVD), atomic layer deposition (ALD), plasma-enhanced ALD (PEALD) or the like, or combinations thereof.

Figure 8:
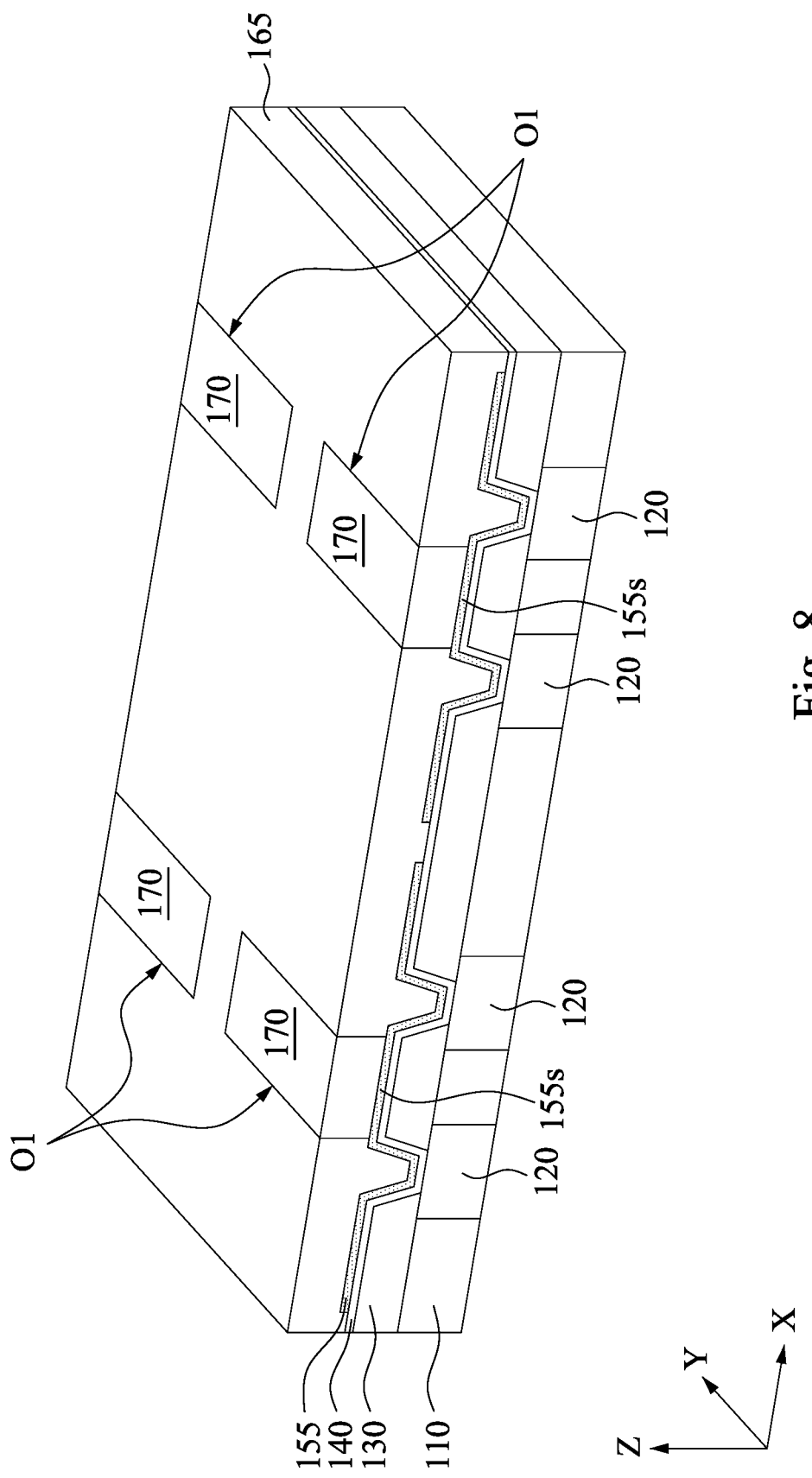

In FIG. 8, a plurality of source lines 170 are formed in the third dielectric layer 165. For example, photolithography and etching processes are performed to form source line openings O1 in the third dielectric layer 130. Source regions 155s of the channel layers 155 are exposed in the source line openings O1. Next, source lines (also denoted as SL) 170 are formed in the source line openings O1. Each source line 170 serves as a shared source electrode for access transistors of memory cells in two adjacent X-directional rows.

In some embodiments, the source lines 170 can be formed by depositing one or more metal materials into the source line openings O1 by using suitable deposition techniques (e.g., CVD, PVD, ALD or the like) until the source line openings O1 are overfilled, followed by performing a CMP process on the one or more metal materials at least until other materials get exposed. The one or more metal materials remaining in the source line openings O1 can serve as source lines 170 each extending along Y-direction. Because the source lines 170 are formed from a same deposition operation, they share a same metal composition. For example, the source lines 170 each include Al, Ti, TiN, TaN, Co, Ag, Au, Cu, Ni, Cr, Hf, Ru, W, Pt, WN, Ru, combinations thereof, or the like. Metal materials of the source lines 170 and the semiconductor materials of channel layers 155 are selected such that the source lines 170 form ohmic contact with source regions 155s of the channel layers 155 (e.g., metal oxide semiconductor films such as IGZO films, ITO films, IZO films, ZnO films, IWO films, or the like), and thus the source regions 155s of the channel layers 155 do not require doped regions, like n-type or p-type doped regions in bulk silicon of CMOS transistors. In some embodiments, each source line 170 is a single-layer pillar, if the source line 170 is formed from a single metal. In some embodiments, each source line 170 is a multilayer pillar, if the source line is formed from two or more metal layers.

Figure 9:
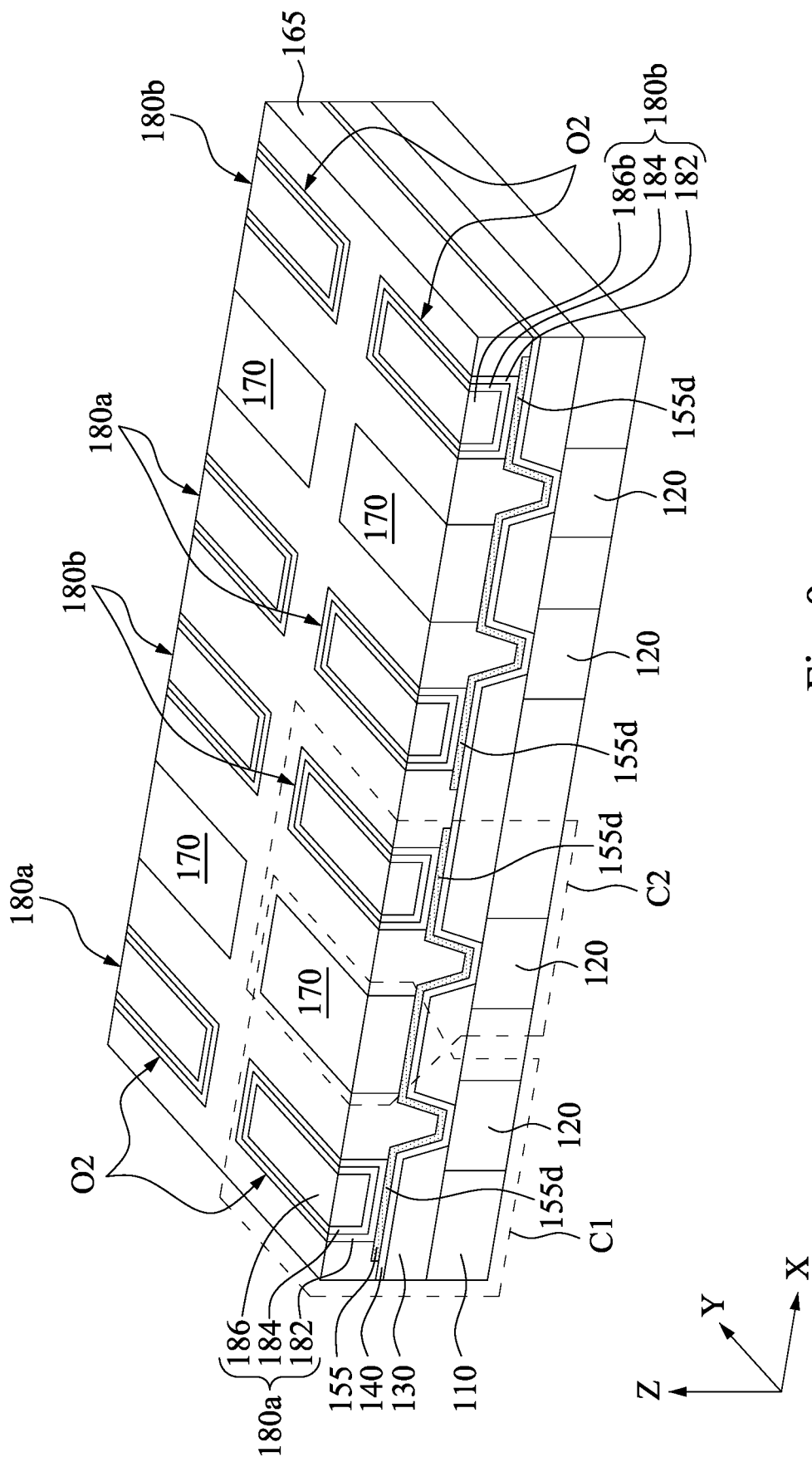

In FIG. 9, a plurality of memory stacks 180a and 180b are formed in the third dielectric layer 130. For example, photolithography and etching processes are performed to form bit line openings O2 in the third dielectric layer 165. The bit line openings O2 are separated from the source lines 170 by the third dielectric layer 165. Drain regions 155d of the channel layers 155 are exposed in the bit line openings O2. Next, memory stacks 180a and 180b are formed in bit line openings O2. Each memory stacks 180a and 180b is a metal-memory material-metal structure that includes an outer electrode 182 lining sidewalls and a bottom surface of a corresponding bit line opening O2, a memory layer 184 enclosed peripherally by the outer electrode 182, and an inner electrode 186a/186b enclosed peripherally by the memory layer 184. The inner electrodes 186a/186b serve as bit lines (also denoted as BL) for memory cells. Formation of the memory stacks 180a and 180b includes conformally depositing a blanket layer of outer electrode material lining the bit line openings O2 by using suitable deposition techniques, conformally depositing a blanket layer of memory material over the blanket layer of the outer electrode material by using suitable deposition techniques, depositing an inner electrode material over the blanket layer of ferroelectric material, and then performing a CMP process to remove an excess inner electrode material, an excess memory material and an excess outer electrode material outside the bit line openings. Remaining portions of the outer electrode material, memory material, and inner electrode materials collectively serve as memory stacks 180 filling the bit line openings O2.

In some embodiments, the outer electrodes 182 of the memory stacks 180a and 180b each include Al, Ti, TiN, TaN, Co, Ag, Au, Cu, Ni, Cr, Hf, Ru, W, Pt, WN, Ru, combinations thereof, or the like. Metal materials of the outer electrodes 182 and the semiconductor materials of channel layers 155 are selected such that the outer electrodes 182 form ohmic contact with drain regions 155d of the channel layers 155 (e.g., metal oxide semiconductor films such as IGZO films, ITO films, IZO films, ZnO films, IWO films, or the like), and thus drain regions 155d of the channel layers 155 do not require doped regions, like n-type or p-type doped regions in bulk silicon of CMOS transistors.

Because the inner electrodes 186a and 186b of different memory stacks 180 are formed from a same deposition operation, they share a same metal composition. For example, the inner electrodes 186a and 186b of the memory stacks 180a and 180 each include Al, Ti, TiN, TaN, Co, Ag, Au, Cu, Ni, Cr, Hf, Ru, W, Pt, WN, Ru, combinations thereof, or the like. In some embodiments, the inner electrodes 186a and 186b are formed from a metal the same as the source lines 170, but different from the outer electrodes 182. In some embodiments, the inner electrodes 186a and 186b are formed from a metal different from the source lines 170, and also different from the outer electrodes 182. In some embodiments, the inner electrodes 186a and 186b, the outer electrodes 182 and the source lines 170 are formed of a same metal.

In some embodiments, the memory stacks 180a and 180b are FE tunnel junction (FTJ) stacks, such that the memory layers 184 are ferroelectric (FE) layers. In some embodiments, the FE layer 184 is formed of $Hf_{1-x}Zr_xO_2$, $HfO_2$, $ZrO_2$, HfTiO, $TiO_2$, NiO, $TaO_x$, $Cu_2O$, $Nb_2O_5$, $AlO_x$, combinations thereof, or the like. Other suitable ferroelectric materials are within the contemplated scope of disclosure. The FE layer 184 may be formed by depositing an FE material over the outer electrode material using any suitable deposition method, such as PVD, spin coating and annealing, sputtering, CVD, ALD, plasma-enhanced chemical vapor deposition (PECVD), spray pyrolysis, pulsed laser deposition (PLD) or combinations thereof. During the deposition process, the outer electrode 182 (e.g., tungsten or other suitable metals) can serve as a seed metal to promote the growth of a desired crystal phase in the FE layer 184. For example, when the FE layer 184 includes a Hf-based FE material, the primary crystal phase of the FE layer 184 may have an orthorhombic crystal structure. In particular, the primary crystal phase may account for at least 50 at %, such as from about 55 at % to about 99 at %, or from about 75 at % to about 90 at % of the FE layer 184. In some embodiments, the FE layer 184 may be thermally annealed, to further improve the crystal structure thereof. For example, the FE layer 184 may be annealed using Excimer-laser annealing (ELA), flash lamp annealing (FLA), furnace annealing, or the like.

Polarization direction (also referred to as polarization orientation) of the FE layer 184 can be switched by an electric field applied by the FTJ electrodes 182 and 186a (186b). The electrical resistance of the FTJ memory stack 180a (180b), also referred to as the tunneling electroresistance (TER) of the FTJ memory stack 180a (180b), depends on the polarization orientation of the FE layer 184. Therefore, by changing the electrostatic potential (e.g., voltage) profile across the FE layer 184, the FTJ memory stack 180a (180b) can change from a high-resistance state to a low-resistance state, or vice versa. The FTJ memory stack 180a (180b) is thus referred to as a resistance-switchable element. Because of this binary nature, FTJ memory stacks 180a and 180b can be used to store digital data, with the low-resistance state corresponding to a first data state (e.g., logical "0"), and the high-resistance state corresponding to a second data state (e.g., logical "1").

In some embodiments, the IC structure includes RRAMs, and the memory layer 184 of the RRAM may be a resistive material such as metal oxide, which may be hafnium oxide, zirconium oxide, aluminum oxide, nickel oxide, tantalum oxide, titanium oxide, and other suitable oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In some other embodiments, the resistive material layer is a metal oxynitride.

In some embodiments, the IC structure includes MRAMs, and the memory layer 184 of the MRAM may be (a) magnetic tunnel junction (MTJ) layer(s). The MTJ layer(s) may include various layers formed of different combinations of materials. In some embodiments, the MTJ layer(s) include a pinning layer, a tunnel barrier layer, and a free layer. In addition, the MTJ layer(s) may have other variations including other layers, such as anti-ferro-magnetic layers. In some embodiments, the pinning layer is formed of PtMn, the tunnel barrier layer is formed of MgO, and the free layer is formed of CoFeB. The magnetic moment of the free layer may be programmed causing the resistance of the resulting MTJ cell to be changed between a high resistance and a low resistance. It is realized that MTJ layer(s) may have many variations, which are also within the scope of the present disclosure.

In FIG. 9, a plurality of memory cells C1 and C2 are formed. Each of the memory cells C1 and C2 includes a word line 120, a gate dielectric layer 140, a channel layer 155, a source line 170, and a memory stack 180. The adjacent memory cells C1 and C2 share the same source line 170, and the channel layer 155 of the memory cell C1 extends to the channel layer 155 of the memory cell C2.

Figure 10A:
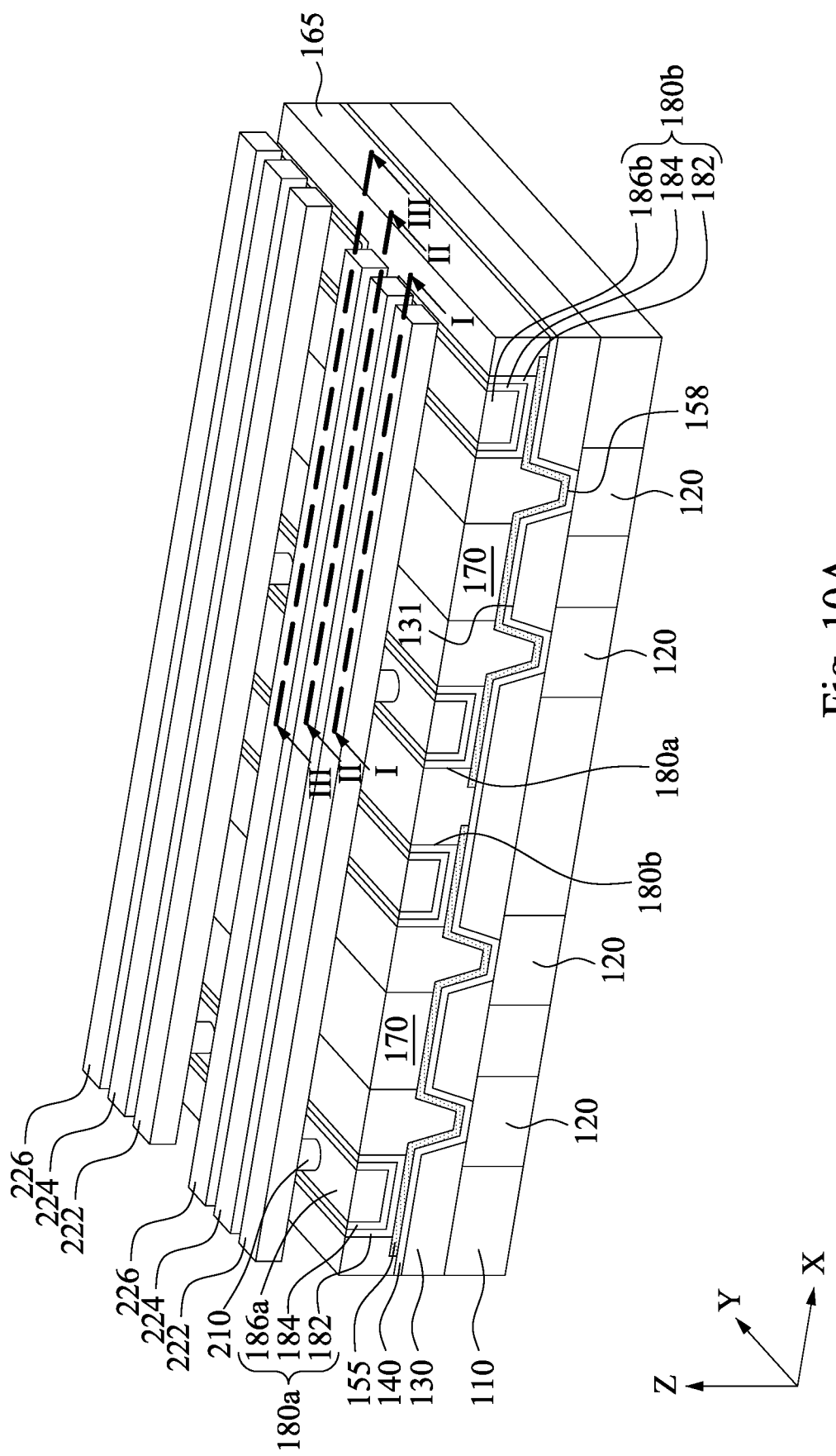
Figure 10B:
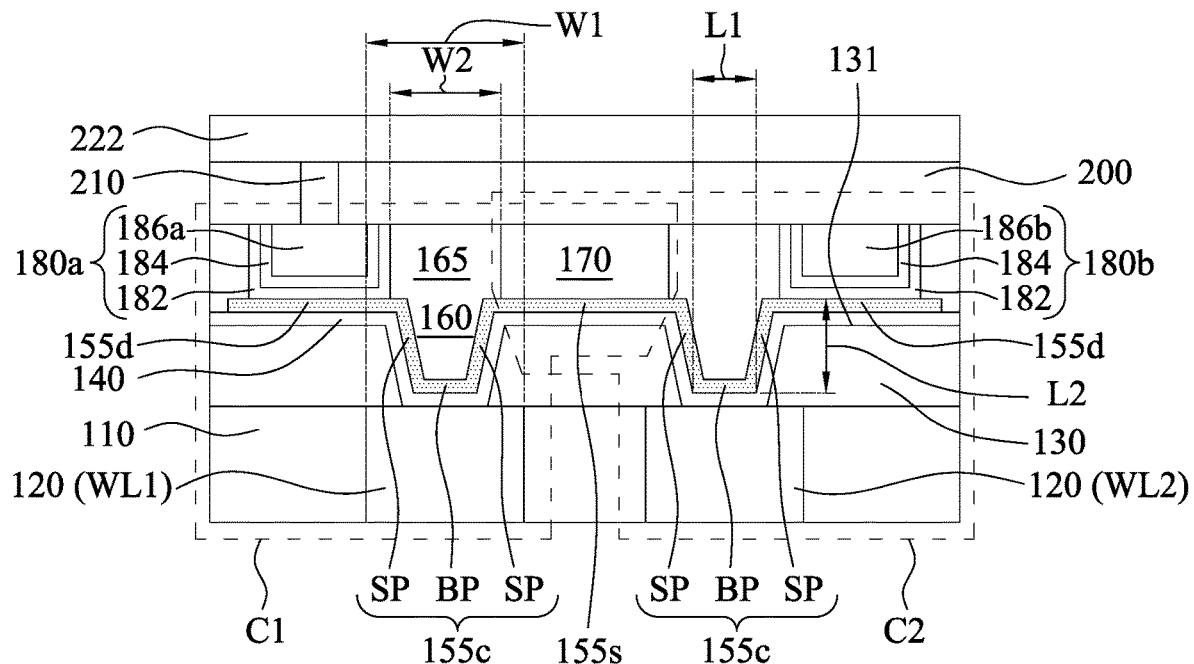
Figure 10C:
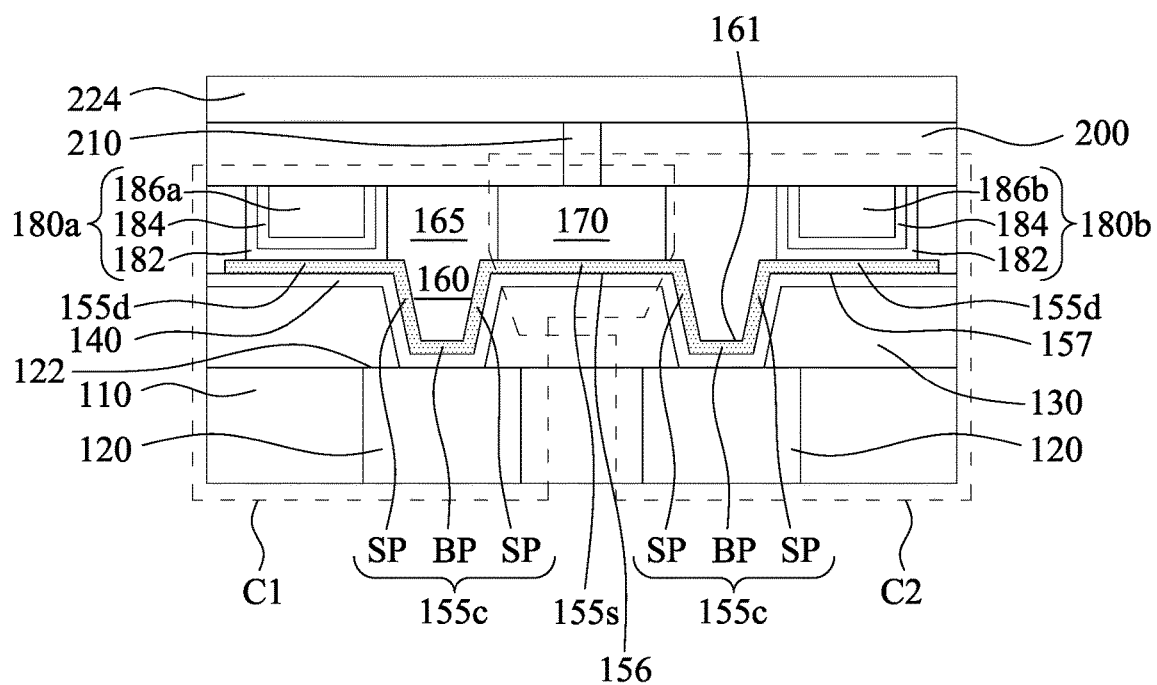
Figure 10D:
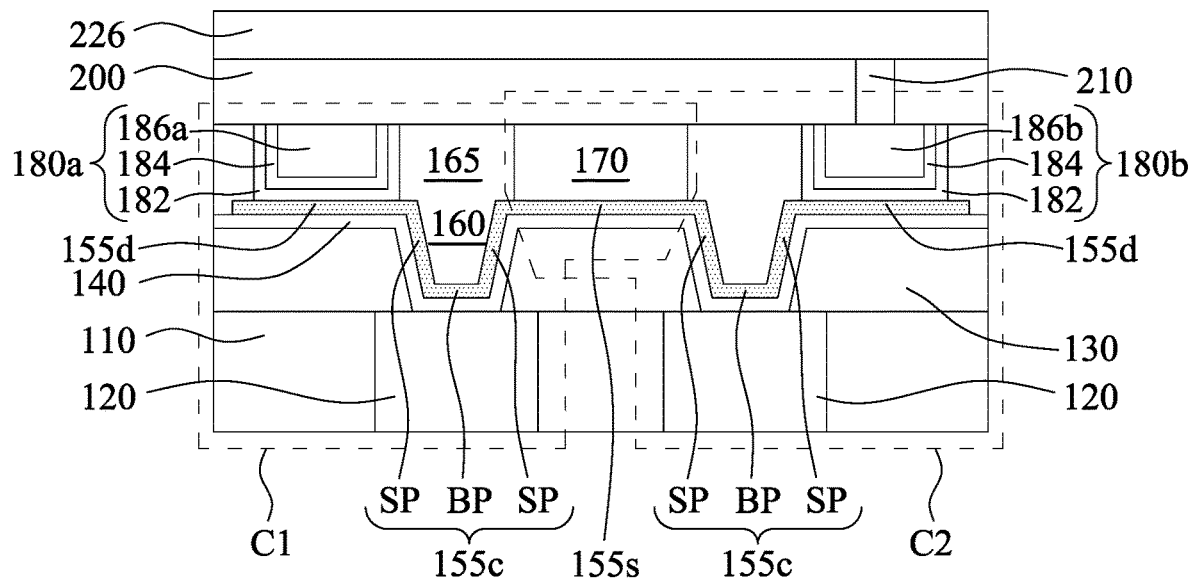

FIG. 10A is a perspective view illustrating metal vias and metal lines formed over the memory cells in accordance with some embodiments of the present disclosure. FIG. 10B is a zoomed-in cross-sectional view taken along line I-I of FIG. 10A. FIG. 10C is a zoomed-in cross-sectional view taken along line II-II of FIG. 10A. FIG. 10D is a zoomed-in cross-sectional view taken along line III-III of FIG. 10A. In FIGS. 10A-10D, metal vias 210 are formed over the source lines 170 and/or the bit lines 186, and metal lines 222, 224, and 226 are formed over the metal vias 210. The metal lines 222 (or 226) electrically coupled to the bit lines 186a (or 186b) by the vias 210 function as global bit lines. The metal lines 224 electrically coupled to the source lines 170 by the vias 210 function as global source lines. In some embodiments, the vias 210 each have a bottom surface area smaller than a top surface area of each source line 170 and a top surface area of each bit line 186.

Formation of the metal vias 210 and metal lines 222, 224, and 226 includes, for example, forming an IMD layer 200 (shown in FIGS. 10B-10D) over the structure as illustrated in FIG. 9, performing photolithography and etching processes to form openings for vias 210 and lines 222, 224, and 226. The openings for vias 210 may be vertical holes extending through IMD layer 200 to expose top surfaces of source lines 170 and top surfaces of the bit lines 186a and 186b, and openings for lines 222, 224, and 226 may be longitudinal trenches extending in X-direction and formed in an upper portion of the IMD layer 200. In some embodiments, the method used to pattern vertical holes and longitudinal trenches in the IMD layer 200 utilizes a via-first scheme, wherein a first photolithography and etch process form holes for vias 210, and a second photolithography and etch process form trenches for lines 222, 224, and 226. Other embodiments may use a different method, for example, a trench-first scheme, or an incomplete via-first scheme, or a buried etch stop layer scheme. The etching techniques may utilize multiple operations. For example, a first main etch operation may remove a portion of the dielectric material of the IMD layer 200 and stop on an etch stop dielectric layer. Then, the etchants may be switched to remove the etch stop layer dielectric materials. The parameters of the various etch operations (e.g., chemical composition, flow rate, and pressure of the gases, reactor power, etc.) may be tuned to produce tapered sidewall profiles with a desired interior taper angle.

Several metal materials may be deposited to fill the holes and trenches forming the metal vias 210 and metal lines 222, 224, and 226. The openings may be first lined with a diffusion barrier metal and then completely filled with a fill metal deposited over the diffusion barrier liner. In some embodiments, a thin metal seed layer may be deposited over the diffusion barrier liner to help initiate an electrochemical plating (ECP) deposition step that completely fills the openings with a fill metal.

The diffusion barrier liner in the vias 210 and lines 222, 224, and 226 includes one or more layers of TaN, Ta, TiN, Ti, Co, or the like, or combinations thereof. The fill metal in the vias 210 and lines 222, 224, and 226 may include metals such as Cu, Al, W, Co, Ru, or the like, or combinations thereof, or multi-layers thereof. The metal materials used in forming the vias 210 and lines 222, 224, and 226 may be deposited by any suitable method, for example, CVD, PECVD, PVD, ALD, PEALD, ECP, electroless plating and the like. In some embodiments, the metal seed layer may be of the same metal material as the fill metal and deposited using a suitable deposition technique (e.g., CVD, PECVD, ALD, PEALD, or PVD, or the like). Any excess conductive material over the IMD layer 200 outside the trenches may be removed by a planarizing process (e.g., CMP) thereby forming a top surface comprising dielectric regions of the IMD layer 200 that are substantially coplanar with conductive regions of the metal lines 222, 224, and 226. The planarization operation embeds the metal vias 210 and metal lines 222, 224, and 226 into the IMD layer 200, as illustrated in FIGS. 10B-10D.

In FIG. 10A, each of the memory cells C1 and C2 includes the word line 120 over the logic circuit structure 500 (see FIG. 1A) including the substrate 502 (see FIG. 1B), the gate dielectric layer 140 over the word line 120, the channel layer (or semiconductive layer) 155 over the gate dielectric layer 140, the source line 170 over the source portion 155s of the channel layer 155, and the memory stack 180 over the drain portion 155d of the channel layer 155. Stated another way, the gate dielectric layer 140 is between the channel layer 155 and the word lines 120.

Specifically, the channel layer 155 has the source portion 155s, the drain portions 155d on opposite sides of the source portion 155s, and the channel portions 155c respectively interconnecting the source portion 155s and each of the drain portions 155d. The source portion 155s and the drain portions 155d are over the top surface of the second dielectric layer 130. The source line 170 is over the source portion 155s of the channel layer 155, and the memory stacks 180a and 180b are respectively over the drain portions 155d.

The channel portions 155c are at positions lower than the source portion 155s and the drain portions 155d and directly over the word lines 120. That is, as shown in FIG. 10A, a bottom surface 158 of the channel portion 155c is lower than the top surface 131 of the second dielectric layer 130. Each of the channel portions 155c are folded and includes sidewall parts SP and a bottom part (or horizontal part) BP. The sidewall parts (or standing parts) SP stand on (or land on) the bottom part BP and extend to the source portion 155s (or the drain portion 155d). The bottom part BP is closest to the word line 120 than the sidewall parts SP, the source portion 155s, and the drain portions 155d. In some embodiments, the whole bottom part BP is directly over the word line 120 such that the word line 120 has a good control on the bottom part BP. Similarly, the sidewall parts SP are directly over the word line 120. Stated another way, a width W2 of the channel portion 155c of the channel layer 155 is smaller than the width W1 of the word line 120. In some embodiments, the sidewall parts SP are inclined to the top surfaces 122 of the word lines. Further, as shown in FIGS. 10B-10D, while portions of the gate dielectric layer 140 in contact with the bottom parts BP are in contact with the word lines 120, portions of the gate dielectric layer 140 in contact with the sidewall parts SP are spaced apart from the word lines 120.

In some embodiments, a channel length L1 of the bottom part BP is different from channel lengths L2 of the sidewall parts SP. For example, the channel length L1 is greater than the channel lengths L2, such that the word lines 120 have a good control on the sidewall parts SP. In some embodiments, the channel lengths L1 and L2 are both smaller than the width W1 of the word lines 120. In some embodiments, the channel length L1 is about 50% to about 100% of the width W1.

The IC structure further includes the dielectric structures 160 respectively covering the channel portions 155c of the channel layers 155. As shown in FIG. 10C, the bottom surface 161 of the dielectric structure 160 is lower than a bottom surface 156 of the source portion 155s of the channel layer 155 and bottom surfaces 157 of the drain portions 155d of the channel layer 155. Further, the second dielectric layer 130 laterally surrounds the dielectric structures 160.

Each of the memory stacks 180a and 180b includes the inner electrode 186a (or 186b) over the drain portion 155d of the channel layer 155, the memory layer 184 surrounding the inner electrode 186a (or 186b), and the outer electrode 182 surrounding the memory layer 184. As shown in FIGS. 10B-10D, each of the memory layer 184 and the outer electrode 182 have a U-shape cross section.

In FIG. 10B, the word line 120 in the left-side memory cell C1 is denoted as WL1, and the word line 120 in the right-side memory cell C2 is denoted as WL2. The word line WL1 serves as a gate electrode for controlling the current flowing in the channel portion 155c in the left-side memory cell C1. The word line WL2 serves as a gate electrode for controlling the current flowing in the channel portion 155c in the right-side memory cell C2. The word line WL1, the source line 170, and the outer electrode 182 collectively function as an access transistor serving to access the left-side memory cell C1. The word line WL2, the source line 170, and the outer electrode 182 collectively function as an access transistor serving to access the right-side memory cell C2. During an operation (e.g., write operation or read operation) of the left-side memory cell C1, a non-zero word line voltage (VWL) greater than threshold voltage of the access transistor is applied to the word line WL1, the word line WL2 is grounded, a non-zero bit line voltage (VBL) is applied to the bit line 186a, and the source line 170 is grounded. During an operation of the right-side memory cell C2, a non-zero word line voltage (VWL) greater than threshold voltage of the access transistor is applied to the word line WL2, the word line WL1 is grounded, a non-zero bit line voltage (VBL) is applied to the bit line 186b, and the source line 170 is grounded.

The short channel effect of the memory cells C1 and C2 depends on the channel length of the channel portions 155c. In FIGS. 10A-10D, since the second dielectric layer 130 has channel recesses 132 for accommodating portions of the channel portions 155c, the channel portions 155c can be extended in a small layout area. The extended channel portions 155c improve the short channel effect and thus lower the power consumption while the cell sizes of the memory cells C1 and C2 are reduced.

Figure 11:
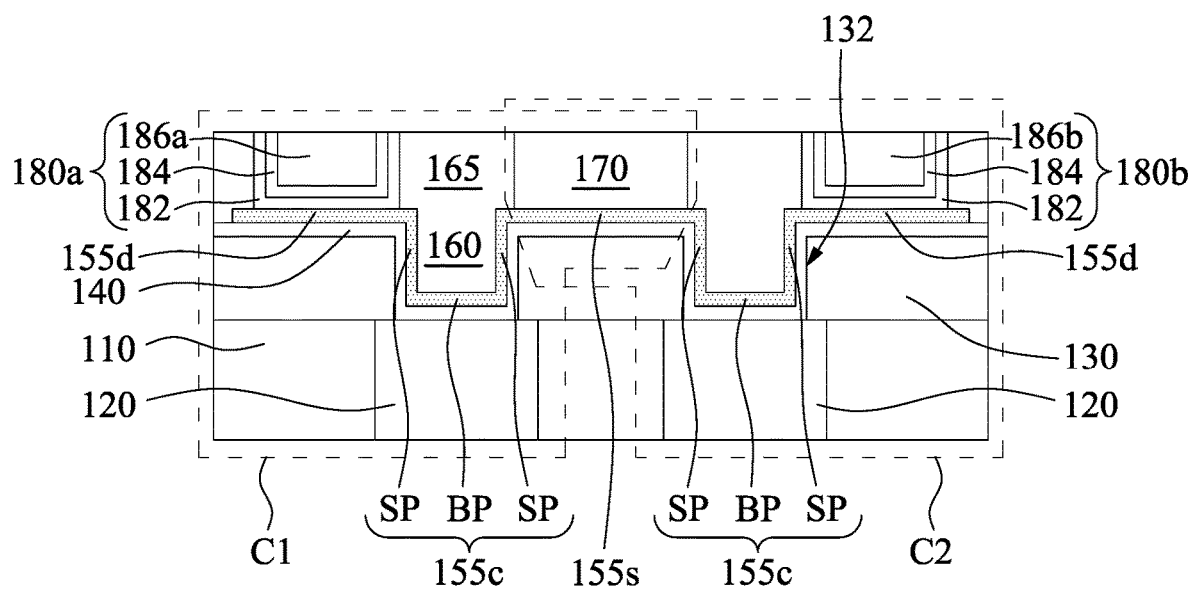
FIGS. 11-15 illustrate cross-sectional views of memory cells in accordance with various embodiments of the present disclosure.

FIGS. 11-15 illustrate cross-sectional views of memory cells C1 and C2 in accordance with various embodiments of the present disclosure. These embodiments result from various scenarios that could occur in the etching process ET1 as illustrated in FIG. 4. If the etching process ET1 etches the second dielectric layer 130 at a constant etch rate, the channel recesses 132 may have substantially vertical sidewalls as illustrated in FIG. 11. In greater detail, the sidewall parts SP may be vertical with respect to the top surface of the second dielectric layer 130.

Figure 12:
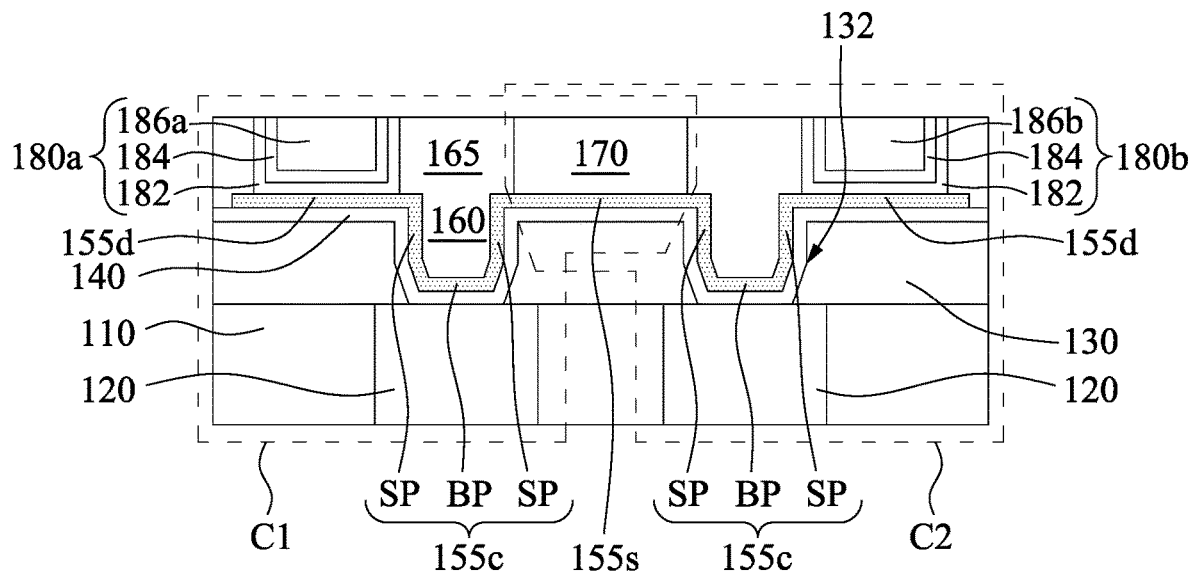

If the etching process ET1 etches an upper portion of the second dielectric layer 130 at a faster etch rate than etching a lower portion of the second dielectric layer 130, each of the channel recesses 132 may have a constant top width with a tapered bottom width as illustrated in FIG. 12. In greater detail, the sidewall parts SP may have a vertical top and an inclined bottom.

Figure 13:
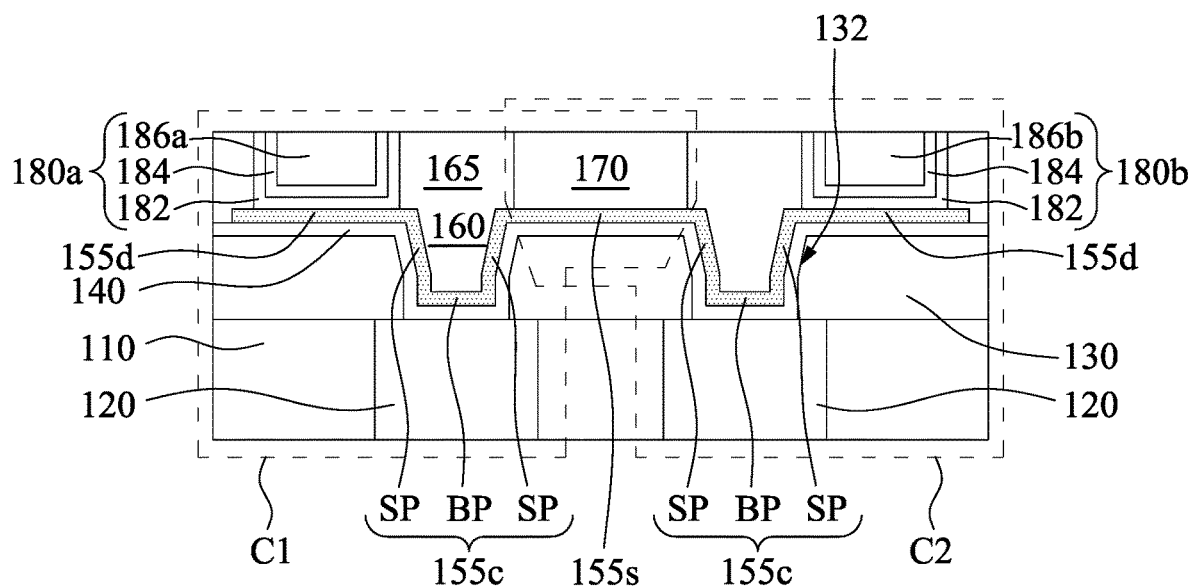

If the etching process ET1 etches an upper portion of the second dielectric layer 130 at a slower etch rate than etching a lower portion of the second dielectric layer 130, each of the channel recesses 132 may have a tapered top width with a constant bottom width as illustrated in FIG. 13. In greater detail, the sidewall parts SP may have an inclined top and a vertical bottom.

Figure 14:
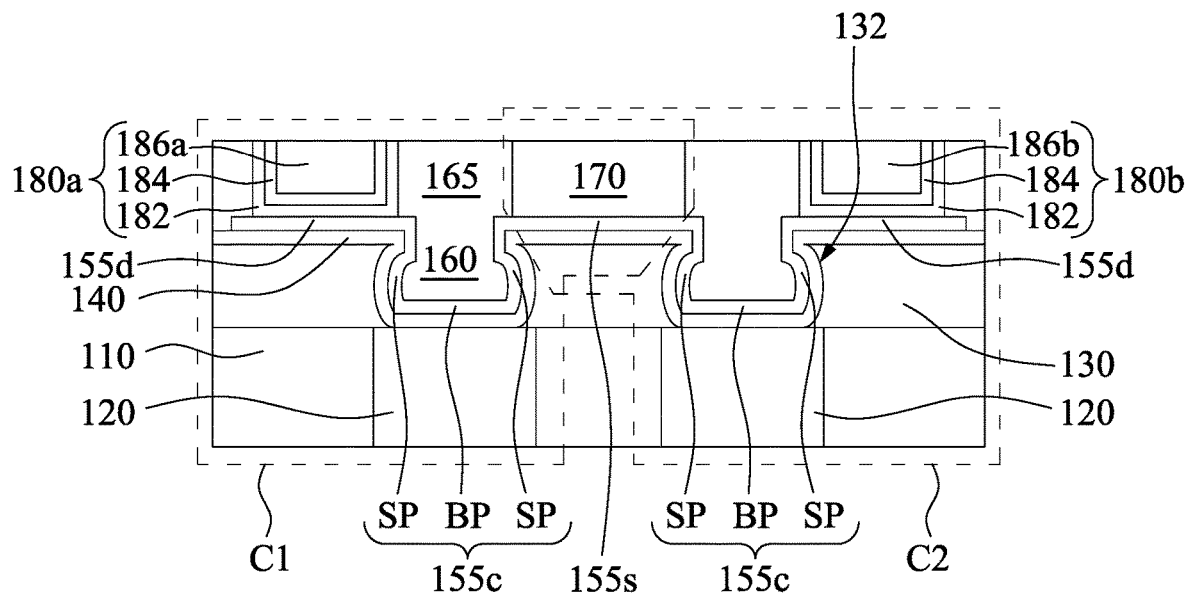

If the etching process ET1 over etches the second dielectric layer 130, each of the channel recesses 132 may have concave sidewalls as illustrated in FIG. 14. In greater detail, the sidewall parts SP may have curved profiles in the cross-sectional view.

Figure 15:
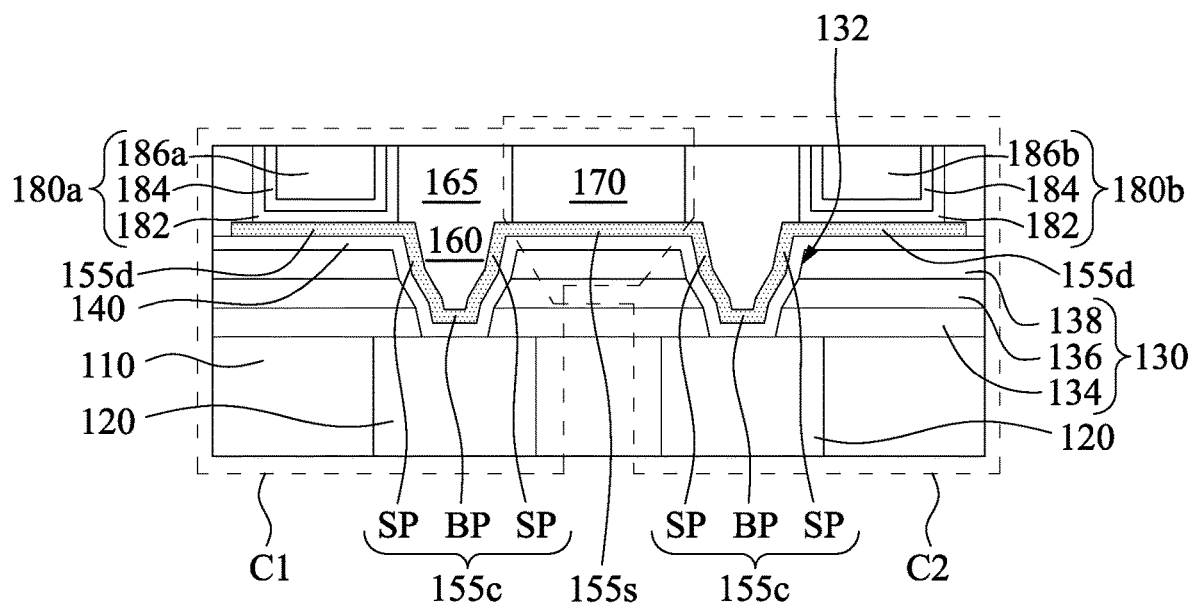

In some other embodiments, as shown in FIG. 15, the second dielectric layer 130 is a nitride-oxide-nitride (NON) stack. That is, the second dielectric layer 130 includes a first nitride layer 134 over the word lines 120, an oxide layer 136 over the first nitride layer 134, and a second nitride layer 138 over the oxide layer 136. The etching process ET1 may cause different etching selectivity in the NON stack, such that the channel recesses 132 have different profiles in the NON stack. For example, sidewalls of the channel recesses 132 in the oxide layer 136 are more slanted than sidewalls of the channel recesses 132 in the first nitride layer 134 and/or the second nitride layer 138. Therefore, the sidewall parts SP have different slopes at different heights. Also, a portion of the gate dielectric layer 140 in contact with the oxide layer 136 has a slope different from a slope of another portion of the gate dielectric layer 140 in contact with the first nitride layer 134 (or the second nitride layer 138).

Further, since the first nitride layer 134 is made of a material different from the first dielectric layer 110 (e.g., oxide layer), the first dielectric layer 110 can be an etch stop layer during etching the first nitride layer 134 if the channel recesses 132 are misaligned with the word lines 120.

Figure 16A:
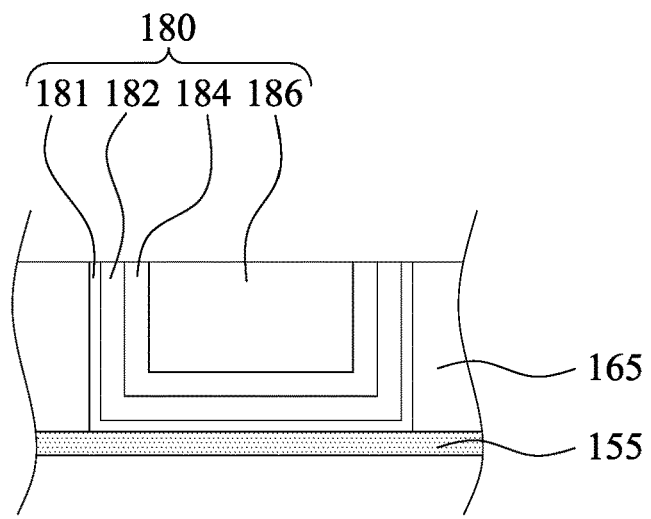
FIGS. 16A and 16B illustrate cross-sectional views of a memory stack in accordance with various embodiments of the present disclosure.
Figure 16B:
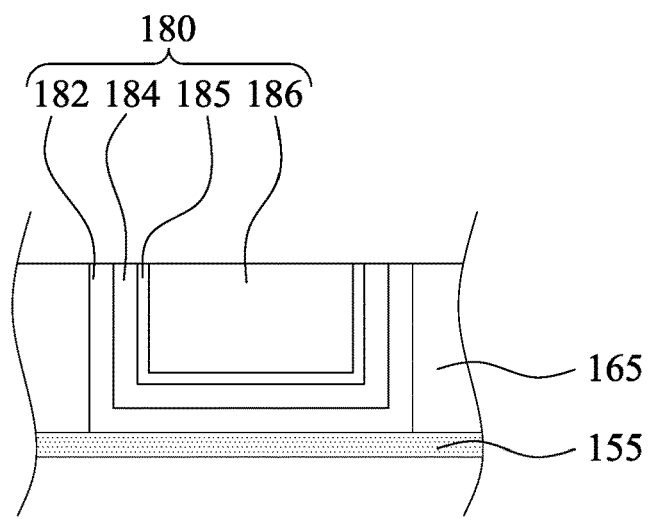

FIGS. 16A and 16B illustrate cross-sectional views of a memory stack 180 in accordance with various embodiments of the present disclosure. In some embodiments, as shown in FIG. 16A, the memory stack 180 further includes a seed layer 181 between the outer electrode 182 and the channel layer 155 for improving an adhesion between the outer electrode 182 and the channel layer 155. For example, when the outer electrode 182 is made of tungsten, the seed layer 181 is made of TiN. In some embodiments, the seed layer 181 is thinner than the outer electrode 182 to reduce the electrical resistance thereof. In some embodiments, as shown in FIG. 16B, the memory stack 180 further includes a seed layer 185 between the inner electrode 186 and the memory layer 184 for improving an adhesion between the inner electrode 186 and the memory layer 184. For example, when the inner electrode 186 is made of tungsten, the seed layer 185 is made of TiN. In some embodiments, the seed layer 185 is thinner than the inner electrode 186 to reduce the electrical resistance thereof.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the channel length of the memory cell can be increased without enlarging the memory cell layout area, because portions of the channel layer are folded. Another advantage is that memory cell density can be increased, because memory cells in adjacent rows share a same source line.

According to some embodiments, a device includes a word line, a dielectric layer, a gate dielectric layer, a semiconductive layer, a source line, and a memory stack. The word line is over a substrate. The dielectric layer is over the word line and has inner sidewalls over the word line. The gate dielectric layer is in contact with the word line and lines a top surface and inner sidewalls of the dielectric layer. The semiconductive layer is conformally over the gate dielectric layer. The semiconductive layer includes a source portion, a drain portion, and a channel portion. The source portion is over the top surface of the dielectric layer. The drain portion is over the top surface of the dielectric layer. The channel portion interconnects the source portion and the drain portion. The channel portion is at a position lower than the source portion. The source line is over the source portion of the semiconductive layer. The memory stack is over the drain portion of the semiconductive layer.

According to some embodiments, a device includes a word line, a channel layer, a gate dielectric layer, a source line, and a memory stack. The word line is over a logic circuit structure. The channel layer is over the word line. The channel layer includes a source portion, a drain portion, and a channel portion. The channel portion interconnects the source portion and the drain portion. The channel portion includes a horizontal part and two standing parts landing on the horizontal part, and the horizontal part is closest to the word line than the standing parts, the source portion, and the drain portion. The gate dielectric layer is between the channel layer and the word line. The source line is over the source portion of the channel layer. The memory stack is over the drain portion of the channel layer.

According to some embodiments, a method includes forming a word line over a substrate; depositing a first dielectric layer to cover the word line; patterning the first dielectric layer to form a channel opening in the first dielectric layer, wherein the channel opening exposes the word line; conformally depositing a gate dielectric layer over the first dielectric layer and in the channel opening; conformally depositing a semiconductive layer over the gate dielectric layer; after depositing the semiconductive layer, depositing a dielectric material to fill the channel opening; forming a source line over a source portion of the semiconductive layer; and forming a memory stack over a drain portion of the semiconductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a word line over a substrate;
   a dielectric layer over the word line and having inner sidewalls over the word line;
   a gate dielectric layer in contact with the word line and lining a top surface and the inner sidewalls of the dielectric layer;
   a semiconductive layer conformally over the gate dielectric layer, wherein the semiconductive layer comprises:
     a source portion over the top surface of the dielectric layer;
     a drain portion over the top surface of the dielectric layer; and
     a channel portion interconnecting the source portion and the drain portion, wherein the channel portion is at a position lower than the source portion;
   a source line over the source portion of the semiconductive layer; and
   a memory stack over the drain portion of the semiconductive layer.

2. The device of claim 1, wherein the memory stack comprises:
   a bit line over the drain portion of the semiconductive layer;
   a memory layer surrounding the bit line; and
   an outer electrode surrounding the memory layer.

3. The device of claim 2, wherein the memory layer is a ferroelectric layer.

4. The device of claim 1, wherein the channel portion is directly over the word line.

5. The device of claim 1, further comprising a dielectric structure covering the channel portion of the semiconductive layer.

6. The device of claim 5, wherein a bottom surface of the dielectric structure is lower than a bottom surface of the source portion of the semiconductive layer.

7. The device of claim 1, wherein a bottom surface of the channel portion of the semiconductive layer is lower than the top surface of the dielectric layer.

8. The device of claim 1, wherein the dielectric layer comprises:
a first nitride layer over the word line;
an oxide layer over the first nitride layer; and
a second nitride layer over the oxide layer, wherein a portion of the gate dielectric layer in contact with the oxide layer has a slope different from a slope of another portion of the gate dielectric layer in contact with first nitride layer.

9. A device comprising:
a word line over a logic circuit structure;
a channel layer over the word line, wherein the channel layer comprises:
　a source portion and a drain portion; and
　a channel portion interconnecting the source portion and the drain portion, wherein the channel portion comprises a horizontal part and two standing parts landing on the horizontal part, at least one of the standing parts is directly over the word line, and the horizontal part is closest to the word line than the standing parts, the source portion, and the drain portion;
a gate dielectric layer between the channel layer and the word line;
a source line over the source portion of the channel layer; and
a memory stack over the drain portion of the channel layer.

10. The device of claim 9, wherein the standing parts are curved in a cross-sectional view.

11. The device of claim 9, wherein one of the standing parts is inclined to a top surface of the word line.

12. The device of claim 9, wherein portions of the gate dielectric layer in contact with the standing parts are spaced apart from the word line.

13. The device of claim 9, wherein a channel length of the horizontal part of the channel portion is greater than a channel length of each of the standing parts of the channel portion.

14. The device of claim 9, wherein a portion of the gate dielectric layer is between the word line and the horizontal part of the channel layer.

15. A method comprising:
forming a word line over a substrate;
depositing a first dielectric layer to cover the word line;
patterning the first dielectric layer to form a channel opening in the first dielectric layer, wherein the channel opening exposes the word line;
conformally depositing a gate dielectric layer over the first dielectric layer and in the channel opening;
conformally depositing a semiconductive layer over the gate dielectric layer;
after depositing the semiconductive layer, depositing a dielectric material to fill the channel opening;
forming a source line over a source portion of the semiconductive layer; and
forming a memory stack over a drain portion of the semiconductive layer.

16. The method of claim 15, wherein the semiconductive layer comprises InGaZnO (IGZO), indium tin oxide (ITO), indium zinc oxide (IZO), ZnO, indium tungsten oxide (IWO).

17. The method of claim 15, wherein patterning the first dielectric layer comprises over etching the first dielectric layer such that an inner sidewall of the channel opening is concave.

18. The method of claim 15, wherein a width of the channel opening is greater than twice a thickness of the semiconductive layer.

19. The method of claim 15, wherein a width of the channel opening is smaller than a width of the word line.

20. The method of claim 15, wherein forming the memory stack comprises:
depositing an outer electrode over the drain portion of the semiconductive layer;
depositing a memory layer over the outer electrode; and
depositing an inner electrode over the memory layer.

* * * * *